(12) United States Patent
Twynam

(10) Patent No.: US 7,893,461 B2
(45) Date of Patent: Feb. 22, 2011

(54) ELECTRONIC DEVICE AND HETEROJUNCTION FET

(75) Inventor: John Kevin Twynam, Yamatokooriyama (JP)

(73) Assignee: Sharp Kabushiki Kaisha, Osaka-Shi (JP)

(*) Notice: Subject to any disclaimer, the term of this patent is extended or adjusted under 35 U.S.C. 154(b) by 19 days.

(21) Appl. No.: 12/484,795

(22) Filed: Jun. 15, 2009

(65) Prior Publication Data

US 2009/0250723 A1    Oct. 8, 2009

Related U.S. Application Data

(62) Division of application No. 11/235,365, filed on Sep. 27, 2005, now Pat. No. 7,566,917.

(30) Foreign Application Priority Data

Sep. 28, 2004    (JP) .................... P2004-281617

(51) Int. Cl.
    *H01L 29/66*    (2006.01)
(52) U.S. Cl. .................... 257/192; 257/183; 257/201
(58) Field of Classification Search ............. 257/192, 257/183, 201
    See application file for complete search history.

(56) References Cited

U.S. PATENT DOCUMENTS

| 6,483,135 B1 | 11/2002 | Mizuta et al. |
| 6,943,076 B2 | 9/2005 | Iwasaki et al. |
| 7,105,390 B2 | 9/2006 | Brask et al. |
| 7,145,174 B2 | 12/2006 | Chiang et al. |
| 2002/0024303 A1 | 2/2002 | Sano et al. |
| 2005/0133818 A1 | 6/2005 | Johnson et al. |
| 2006/0158090 A1 | 7/2006 | Wang et al. |

FOREIGN PATENT DOCUMENTS

| JP | 2000-100831 A | 4/2000 |
| JP | 2000-252299 A | 9/2000 |

OTHER PUBLICATIONS

N. Q. Zhang et al., IEEE Electron Device Letters, vol. 21, No. 9, Sep. 2000, p. 421-423.
N. Q. Zhang et al., "High Breakdown GaN HEMT with Overlapping Gate Structure", IEEE, Electron Device Letters, vol. 21, No. 9, (2000), pp. 373-375.

*Primary Examiner*—Douglas M Menz
(74) *Attorney, Agent, or Firm*—Birch, Stewart, Kolasch & Birch, LLP

(57) ABSTRACT

In an electronic device of the present invention a gate Schottky electrode is formed on an active layer constructed of a GaN layer and an AlGaN layer, and a source ohmic electrode and a drain ohmic electrode are further formed on both sides of the gate Schottky electrode on the active layer. A dielectric layer ($TiO_2$ layer) of a stepwise laminate structure is formed on the AlGaN layer so that the electric field distribution between the gate Schottky electrode and the drain ohmic electrode is substantially uniformed. The dielectric constant of $TiO_2$ of the dielectric layer is made higher than the dielectric constant of GaN and AlGaN of the active layer.

11 Claims, 12 Drawing Sheets

US 7,893,461 B2

ELECTRONIC DEVICE AND HETEROJUNCTION FET

CROSS-REFERENCE TO RELATED APPLICATION

This application is a Divisional of co-pending application Ser. No. 11/235,365, filed on Sep. 27, 2005, now U.S. Pat. No. 7,566,917 the entire contents of which are hereby incorporated by reference and for which priority is claimed under 35 U.S.C. §120 which claims priority under 35 U.S.C. §119(a) on Patent Application No. 2004-281617 filed in Japan on Sep. 28, 2004, the entire contents of which are hereby incorporated by reference.

BACKGROUND OF THE INVENTION

The present invention relates to electronic devices and a heterojunction FET (Field Effect Transistor) suitable particularly for a GaN heterojunction FET.

Conventionally, as an electronic device, there has been a GaN heterojunction FET shown in FIG. 11 (refer to, for example, a first reference: Zhang, n.-Q. and five others, "High Breakdown GaN HEMT with Overlapping Gate Structure", IEEE, Electron Device Letters, Vol. 21, p. 373-375 and p. 421-423 September 2000). FIG. 11 shows a sectional view of the GaN heterojunction FET. As shown in FIG. 11, the GaN heterojunction FET is formed by successively forming a GaN layer 1102 that is made of undoped GaN and has a thickness of about 3 μm and an $Al_{0.5}Ga_{0.5}N$ layer 1103 that is made of undoped $Al_{0.5}Ga_{0.5}N$ and has a thickness of 20 nm on a sapphire substrate 1101 and successively forming a source ohmic electrode 1105 made of Ti/Al/Ni/Au, a gate Schottky electrode 1106 made of Ni/Au and a drain ohmic electrode 1107 made of Ti/Al/Ni/Au on the $Al_{0.5}Ga_{0.5}N$ layer 1103. A 2DEG (Two-Dimensional Electron Gas) 1104 is generated in a region at a boundary between the GaN layer 1102 and the $Al_{0.5}Ga_{0.5}N$ layer 1103. The 2DEG has a concentration of $8 \times 10^{12}$ cm$^{-2}$. Moreover, an isolation mesa 1112 for element isolation is formed.

In the conventional GaN heterojunction FET, when an electric field located between the gate Schottky electrode 1106 and the drain ohmic electrode 1107 exceeds the breakdown electric field of the semiconductor, the dielectric breakdown of the device occurs. When the semiconductor is GaN, the breakdown electric field Emax is about 5 MV/cm. In this case, given that an interval between the drain ohmic electrode 1107 and the gate Schottky electrode 1106 is Ldg and a drain-gate voltage is Vdg, then an average electric field is expressed as Vdg/Ldg. However, the electric field distribution is generally nonuniform, and the electric field is maximized in the vicinity of the gate Schottky electrode 1106. Since the maximum electric field is normally higher than the average electric field, the normal device has a withstand voltage lower than (Ldg·Emax).

The device structure of the GaN heterojunction FET shown in FIG. 12 is the same as the structure of the conventional GaN heterojunction FET shown in FIG. 11. FIG. 12 shows electrical potentials together with the device structure. The electrical potentials are calculated by simulation. A problem that the present invention intends to solve will now be described in detail below referring to the sectional view of the heterojunction FET shown in FIG. 12.

A 3-μm thick GaN layer 1202 made of undoped GaN and a 20-nm thick $Al_{0.5}Ga_{0.5}N$ layer 1203 made of undoped $Al_{0.5}Ga_{0.5}N$ are formed on a sapphire substrate 1201, and a source ohmic electrode 1205, a gate Schottky electrode 1206 and a drain ohmic electrode 1207 are formed on the $Al_{0.5}Ga_{0.5}N$ layer 1203. A 2DEG 1204 is generated in a region at a boundary between the GaN layer 1202 and the $Al_{0.5}Ga_{0.5}N$ layer 1203. The 2DEG has a concentration of $8 \times 10^{12}$ cm$^{-2}$ in this case. In this case, the interval Ldg between the drain ohmic electrode 1207 and the gate Schottky electrode 1206 is 3 μm, a drain-source voltage Vds is 400 V, and a gate-source voltage Vgs is −10 V. In the case of the bias conditions, the device is in the off state (state in which the channel is depleted and no current flows).

Each portion where the electrical potential interval is narrow in FIG. 12 indicates that the electric field is high. As is apparent from FIG. 12, it can be understood that the electric field is raised in the neighborhood of the gate Schottky electrode 1206. It can be understood that the maximum electric field reaches up to 9.48 MV/cm on the bias conditions, which largely exceeds the breakdown electric field Emax (about 5 MV/cm) according to the simulation results. If voltages of the same bias conditions are applied to the actual GaN heterojunction FET, dielectric breakdown occurs.

The degree of concentration of the electrical potential in a region near the gate electrode depends on the concentration of fixed charge concentration located in the vicinity of the channel of the device. In a practical GaN heterojunction FET, the fixed charge concentration can be controlled to some extent by the composition or impurity doping of the AlGaN layer. The 2DEG concentration Ns is high and the on-state resistance is low when the device is in the on state in the case where the fixed charge concentration is high. Therefore, the degree of electric field concentration in the off state is high, and the withstand voltage becomes low. However, it is desirable that the on-state resistance is low and the off-state withstand voltage is high.

The gate electrode and the drain electrode of the GaN heterojunction FET are located on the identical surface of the semiconductor layer, and a voltage applied across the gate electrode and the drain electrode is high. The field plate structure is not effective for the GaN heterojunction FET unlike the FET of GaAs or Si. When a field plate is used for such a GaN heterojunction FET, there is a problem that the dielectric breakdown occurs in the insulator since the electric field of the insulator on the lower side of the field plate is high although the maximum electric field of the semiconductor layer is low (The breakdown electric field of a normal insulator is higher than that of the breakdown electric field of GaAs or Si but on the same level as that of GaN.).

SUMMARY OF THE INVENTION

An object of the present invention is to provide an electronic device capable of raising the withstand voltage by uniforming the electric field distribution between the electrodes with a simple construction.

In order to achieve the object, the present invention provides an electronic device having an active layer, comprising:

a plurality of electrodes formed on the active layer; and a dielectric layer formed on the active layer so that an electric field distribution between at least two of the plurality of electrodes is substantially uniformed. In this case, the "active layer" herein means a layer that is constructed generally of a semiconductor or an insulator and performs transmission, switching and amplification of a signal.

According to the electronic device of the construction, by using a dielectric of, for example, $TiO_2$ or $HfO_2$ of a high dielectric constant for the dielectric layer formed on the active layer, the electric field distribution between at least two of the plurality of electrodes formed on the active layer can be substantially uniformed (According to the Maxwell equation "div($\in$E)=ρ", where a charge density ρ exists, the slope of the electric field E becomes reduced as the dielectric constant $\in$ becomes higher.). Therefore, a high withstand voltage can be achieved by uniforming the electric field distribution between the electrodes with a simple construction without employing a field plate structure for shielding the electric field.

Moreover, in one embodiment of the electronic device, the dielectric layer has a dielectric constant $\in 2$ higher than a dielectric constant $\in 1$ of the active layer.

According to the embodiment, the electric field distribution between the electrodes can easily be uniformed by making the dielectric constant $\in 2$ of the dielectric layer higher than the dielectric constant $\in 1$ of the active layer.

Moreover, in one embodiment of the electronic device, assuming that a thickness of the active layer is t1 and a maximum thickness of the dielectric layer is t2max, then a relation of a product $t2max \cdot \in 2$ of the maximum thickness t2max of the dielectric layer and the dielectric constant $\in 2$ of the dielectric layer to a product $t1 \cdot \in 1$ of the thickness t1 of the active layer and the dielectric constant $\in 1$ of the active layer satisfies a condition:

$$t2max \cdot \in 2 > t1 \cdot \in 1.$$

According to the embodiment, by making the product $t2max \cdot \in 2$ of the maximum thickness t2max of the dielectric layer and the dielectric constant $\in 2$ of the dielectric layer greater than the product $t1 \cdot \in 1$ of the thickness t1 of the active layer and the dielectric constant $\in 1$ of the active layer, the electric field distribution between the electrodes can more easily be uniformed.

Moreover, in one embodiment of the electronic device, assuming that an interval between the electrodes between which the electric field distribution is substantially uniformed is L, and a maximum thickness of the dielectric layer is t2max, then a relation of a product $t2max \cdot \in 2$ of the maximum thickness t2max of the dielectric layer and the dielectric constant $\in 2$ of the dielectric layer to a product $L \cdot \in 1$ of the interval L between the electrodes and the dielectric constant $\in 1$ of the active layer satisfies a condition:

$$t2max \cdot \in 2 > L \cdot \in 1.$$

According to the embodiment, by making the product $t2max \cdot \in 2$ of the maximum thickness t2max of the dielectric layer and the dielectric constant $\in 2$ of the dielectric layer greater than the product $L \cdot \in 1$ of the interval L between the electrodes and the dielectric constant $\in 1$ of the active layer, the electric field distribution between the electrodes can more easily be uniformed.

Moreover, in one embodiment of the electronic device, assuming that a thickness of the active layer is t1 and a maximum thickness of the dielectric layer is t2max, then a relation of a product $t2max \cdot \in 2$ of the maximum thickness t2max of the dielectric layer and the dielectric constant $\in 2$ of the dielectric layer to a product $t1 \cdot \in 1$ of the thickness t1 of the active layer and the dielectric constant $\in 1$ of the active layer satisfies a condition:

$$t2max \cdot \in 2 > t1 \cdot \in 1, \text{ and,}$$

assuming that an interval between the electrodes between which the electric field distribution is substantially uniformed is L and a maximum thickness of the dielectric layer is t2max, then a relation of a product $t2max \cdot \in 2$ of the maximum thickness t2max of the dielectric layer and the dielectric constant $\in 2$ of the dielectric layer to a product $L \cdot \in 1$ of the interval L between the electrodes and the dielectric constant $\in 1$ of the active layer satisfies a condition:

$$t2max \cdot \in 2 > L \cdot \in 1.$$

According to the embodiment, by making the product $t2max \cdot \in 2$ of the maximum thickness t2max of the dielectric layer and the dielectric constant $\in 2$ of the dielectric layer greater than the product $t1 \cdot \in 1$ of the thickness t1 of the active layer and the dielectric constant $\in 1$ of the active layer and making the product $t2max \cdot \in 2$ of the maximum thickness t2max of the dielectric layer and the dielectric constant $\in 2$ of the dielectric layer greater than the product $L \cdot \in 1$ of the interval L between the electrodes and the dielectric constant $\in 1$ of the active layer, the electric field distribution between the electrodes can more reliably be uniformed.

Moreover, in one embodiment of the electronic device, the dielectric layer has a stepwise laminate structure in which a number of layers is varied step by step, and a sum of products of a thickness and a dielectric constant of each of the steps of the dielectric layer is reduced from one toward the other of the electrodes between which the electric field distribution is substantially uniformed.

According to the embodiment, by reducing the sum of the products of the thickness and the dielectric constant of each of the steps of the dielectric layer from one toward the other of the electrodes so that the electric field distribution is substantially uniformed, a stepwise dielectric layer that more reliably uniforms the electric field distribution between the electrodes can simply be formed.

Moreover, in one embodiment of the electronic device, a thickness of the dielectric layer is reduced or a dielectric constant of the dielectric layer is reduced from one toward the other of the electrodes between which the electric field distribution is substantially uniformed.

According to the embodiment, by reducing the thickness of the dielectric layer from one toward the other of the electrodes between which the electric field distribution is substantially uniformed, a dielectric layer that more reliably uniforms the electric field distribution between the electrodes can simply be formed. Otherwise, by reducing the dielectric constant of the dielectric layer from one toward the other of the electrodes between which the electric field distribution is substantially uniformed, a stepwise dielectric layer that more reliably uniforms the electric field distribution between the electrodes can simply be formed.

Moreover, in one embodiment of the electronic device, the active layer is made of a group III nitride based compound semiconductor.

According to the embodiment, in the device in which the group III nitride based compound semiconductor is used for the active layer, the effect by virtue of the uniforming of the electric field distribution by the dielectric layer is particularly remarkable.

Moreover, in one embodiment of the electronic device, the dielectric layer contains a metal oxide.

According to the embodiment, by containing the metal oxide in the dielectric layer, a dielectric layer of a high dielectric constant can easily be formed.

Moreover, in one embodiment of the electronic device, the dielectric layer is formed so that no stress is applied to the active layer.

According to the embodiment, for example, when the group III nitride based compound semiconductor that produces an intense piezoelectric effect is used for the active layer, it is possible that a stress is generated on the surface of the active layer and a change in the concentration of a 2DEG occurs. The change in the concentration of the 2DEG is undesirable in terms of the electronic device characteristics. Therefore, it is desirable to form the dielectric layer so that no stress is applied to the semiconductor. In particular, it is preferable to form the dielectric layer by the sputtering or spin coating method.

Moreover, the present invention provides a heterojunction FET, comprising:

a gate electrode formed on an active layer comprised of a semiconductor;

a source electrode and a drain electrode formed on both sides of the gate electrode on the active layer; and a dielectric layer formed on the active layer so that an electric field distribution between at least one of the source electrode and the drain electrode and the gate electrode is substantially uniformed. In this case, the "active layer" herein means a layer that performs transmission, switching and amplification of a signal.

According to the heterojunction FET of the construction, by employing, for example, a dielectric of a high dielectric constant for the dielectric layer formed on the active layer, it is easy to substantially uniform the electric field distribution between at least one of the source electrode and the drain electrode and the gate electrode formed on the active layer. Therefore, a high withstand voltage can be achieved by uniforming the electric field distribution between the electrodes with a simple construction without employing the field plate structure for shielding the electric field.

Moreover, in one embodiment of the heterojunction FET, the dielectric layer has a dielectric constant $\in 2$ higher than a dielectric constant $\in 1$ of the active layer.

According to the embodiment, by making the dielectric constant $\in 2$ of the dielectric layer higher than the dielectric constant $\in 1$ of the active layer, the electric field distribution between the electrodes can easily be uniformed.

Moreover, in one embodiment of the heterojunction FET, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$t2\mathrm{max}\cdot\in 2 > t1\cdot\in 1$.

According to the embodiment, by making the product t2max·$\in 2$ of the maximum thickness t2max of the dielectric layer and the dielectric constant $\in 2$ of the dielectric layer greater than the product t1·$\in 1$ of the thickness t1 of the active layer and the dielectric constant $\in 1$ of the active layer, the electric field distribution between the electrodes can more easily be uniformed.

Moreover, in one embodiment of the heterojunction FET, assuming that an interval between the electrodes between which the electric field distribution is substantially uniformed is L and a maximum thickness of the dielectric layer is t2max, then a relation of a product t2max·$\in 2$ of the maximum thickness t2max of the dielectric layer and the dielectric constant $\in 2$ of the dielectric layer to a product L·$\in 1$ of the interval L between the electrodes and the dielectric constant $\in 1$ of the active layer satisfies a condition:

$t2\mathrm{max}\cdot\in 2 > L\cdot\in 1$.

According to the embodiment, by making the product t2max·$\in 2$ of the maximum thickness t2max of the dielectric layer and the dielectric constant $\in 2$ of the dielectric layer greater than the product L·$\in 1$ of the interval L between the electrodes and the dielectric constant $\in 1$ of the active layer, the electric field distribution between the electrodes can more easily be uniformed.

Moreover, in one embodiment of the heterojunction FET, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$t2\mathrm{max}\cdot\in 2 > t1\cdot\in 1$, and, assuming that an interval between the electrodes between which the electric field distribution is substantially uniformed is L and a maximum thickness of the dielectric layer is t2max, then a relation of a product t2max·$\in 2$ of the maximum thickness t2max of the dielectric layer and the dielectric constant $\in 2$ of the dielectric layer to a product L·$\in 1$ of the interval L between the electrodes and the dielectric constant $\in 1$ of the active layer satisfies a condition:

$t2\mathrm{max}\cdot\in 2 > L\cdot\in 1$.

According to the embodiment, by making the product t2max·$\in 2$ of the maximum thickness t2max of the dielectric layer and the dielectric constant $\in 2$ of the dielectric layer greater than the product t1·$\in 1$ of the thickness t1 of the active layer and the dielectric constant $\in 1$ of the active layer and making the product t2max·$\in 2$ of the maximum thickness t2max of the dielectric layer and the dielectric constant $\in 2$ of the dielectric layer greater than the product L·$\in 1$ of the interval L between the electrodes and the dielectric constant $\in 1$ of the active layer, the electric field distribution between the electrodes can more reliably be uniformed.

Moreover, in one embodiment of the heterojunction FET, the dielectric layer has a stepwise laminate structure in which a number of layers is varied step by step, and a sum of products of a thickness and a dielectric constant of each of the steps of the dielectric layer is reduced from one toward the other of the electrodes between which the electric field distribution is substantially uniformed.

According to the embodiment, by reducing the sum of the products of the thickness and the dielectric constant of each of the steps of the dielectric layer from one toward the other of the electrodes so that the electric field distribution is substantially uniformed, a stepwise dielectric layer that more reliably uniforms the electric field distribution between the electrodes can simply be formed. In this case, the product of the thickness and the dielectric constant of each step of the dielectric layer is reduced step by step from the negative electrode side when the semiconductor of the active layer is of the n-type. The product of the thickness and the dielectric constant of each step of the dielectric layer is reduced step by step from the positive electrode side when the semiconductor of the active layer is of the p-type.

Moreover, in one embodiment of the heterojunction FET, a thickness of the dielectric layer is reduced or a dielectric constant of the dielectric layer is reduced from one toward the other of the electrodes between which the electric field distribution is substantially uniformed.

According to the embodiment, by reducing the thickness of the dielectric layer from one toward the other of the electrodes between which the electric field distribution is substantially uniformed, a dielectric layer that more reliably uniforms the electric field distribution between the electrodes can simply be formed. Otherwise, by reducing the dielectric constant of the dielectric layer from one toward the other of the electrodes between which the electric field distribution is substantially uniformed, a stepwise dielectric layer that more reliably uniforms the electric field distribution between the electrodes can simply be formed.

Moreover, in one embodiment of the heterojunction FET, the active layer is made of a group III nitride based compound semiconductor.

According to the embodiment, in the device in which the group III nitride based compound semiconductor is used for the active layer, the effect by virtue of the uniforming of the electric field distribution by the dielectric layer is particularly remarkable.

Moreover, in one embodiment of the heterojunction FET, the dielectric layer contains a metal oxide.

According to the embodiment, by containing the metal oxide in the dielectric layer, a dielectric layer of a high dielectric constant can easily be formed.

Moreover, in one embodiment of the heterojunction FET, the dielectric layer is formed so that no stress is applied to the active layer.

According to the embodiment, for example, when the group III nitride based compound semiconductor that produces an intense piezoelectric effect is used for the active layer, it is possible that a stress is generated on the surface of the active layer and a change in the concentration of a 2DEG occurs. The change in the concentration of the 2DEG is undesirable in terms of the electronic device characteristics. Therefore, it is desirable to form the dielectric layer so that no stress is applied to the semiconductor. In particular, it is preferable to form the dielectric layer by the sputtering or spin coating method.

As is apparent from the above, according to the electronic device and the heterojunction FET of the present invention, the maximum electric field between the electrodes is lowered, and the withstand voltage can be raised. Moreover, since no electric field concentration occurs even if the carrier density of the electronic device is high, the withstand voltage can be raised regardless of the fact that the channel resistance is low.

The present invention is effective for various electronic devices of an SAW (Surface Acoustic Wave) device, an MEMS (Micro Electro Mechanical System) and the like, and the present invention is effective for any device that has two or more electrodes on an identical surface of the active layer and a voltage is applied across the electrodes.

Moreover, since the electric field becomes very high in semiconductor devices (FET, diode, etc.), the present invention is especially effective. Furthermore, the device for which the present invention is most effective is a GaN based heterojunction FET.

In another aspect, the present invention provides an electronic device having an active layer, comprising:

a plurality of electrodes and a dielectric layer formed on the active layer, the dielectric layer having a dielectric constant $\in 2$ higher than a dielectric constant $\in 1$ of the active layer.

According to the electronic device of the construction, the electric field distribution between the electrodes can be reduced.

In one embodiment of the electronic device, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$$t2\text{max} \cdot \in 2 > t1 \cdot \in 1.$$

According to the embodiment, by making the product t2max·$\in 2$ of the maximum thickness t2max of the dielectric layer and the dielectric constant $\in 2$ of the dielectric layer greater than the product t1·$\in 1$ of the thickness t1 of the active layer and the dielectric constant $\in 1$ of the active layer, the electric field distribution between the electrodes can be uniformed.

In another aspect, the present invention provides a heterojunction FET, comprising:

a gate electrode and a dielectric layer formed on an active layer comprised of a semiconductor layer; and a source electrode and a drain electrode formed on both sides of the gate electrode on the active layer, the dielectric layer having a dielectric constant $\in 2$ higher than a dielectric constant $\in 1$ of the active layer.

According to the heterojunction FET of the construction, the electric field distribution between the electrodes can be reduced.

In one embodiment of the heterojunction FET, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$$t2\text{max} \cdot \in 2 > t1 \cdot \in 1.$$

According to the embodiment, by making the product t2max·$\in 2$ of the maximum thickness t2max of the dielectric layer and the dielectric constant $\in 2$ of the dielectric layer greater than the product t1·$\in 1$ of the thickness t1 of the active layer and the dielectric constant $\in 1$ of the active layer, the electric field distribution between the electrodes can be uniformed.

In another aspect, the present invention provides an electronic device having an active layer, comprising:

a plurality of electrodes and a dielectric layer formed on the active layer; and a dielectric layer formed on the active layer so that a difference between maximum value and minimum value of an electric field distribution between at least two of the plurality of electrodes is reduced.

According to the electronic device of the construction, the electric field distribution between at least two of the plurality of electrodes formed on the active layer can be substantially uniformed. Therefore, a high withstand voltage can be achieved without employing a field plate structure for shielding the electric field.

In another aspect, the present invention provides a heterojunction FET, comprising:

a gate electrode formed on an active layer comprised of a semiconductor;

a source electrode and a drain electrode formed on both sides of the gate electrode on the active layer; and a dielectric layer formed on the active layer so that a difference between maximum value and minimum value of an electric field distribution between at least one of the source electrode and the drain electrode and the gate electrode is reduced.

According to the heterojunction FET of the construction, the electric field distribution between at least one of the source electrode and the drain electrode and the gate electrode formed on the active layer can be substantially uniformed.

Therefore, a high withstand voltage can be achieved without employing the field plate structure for shielding the electric field.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
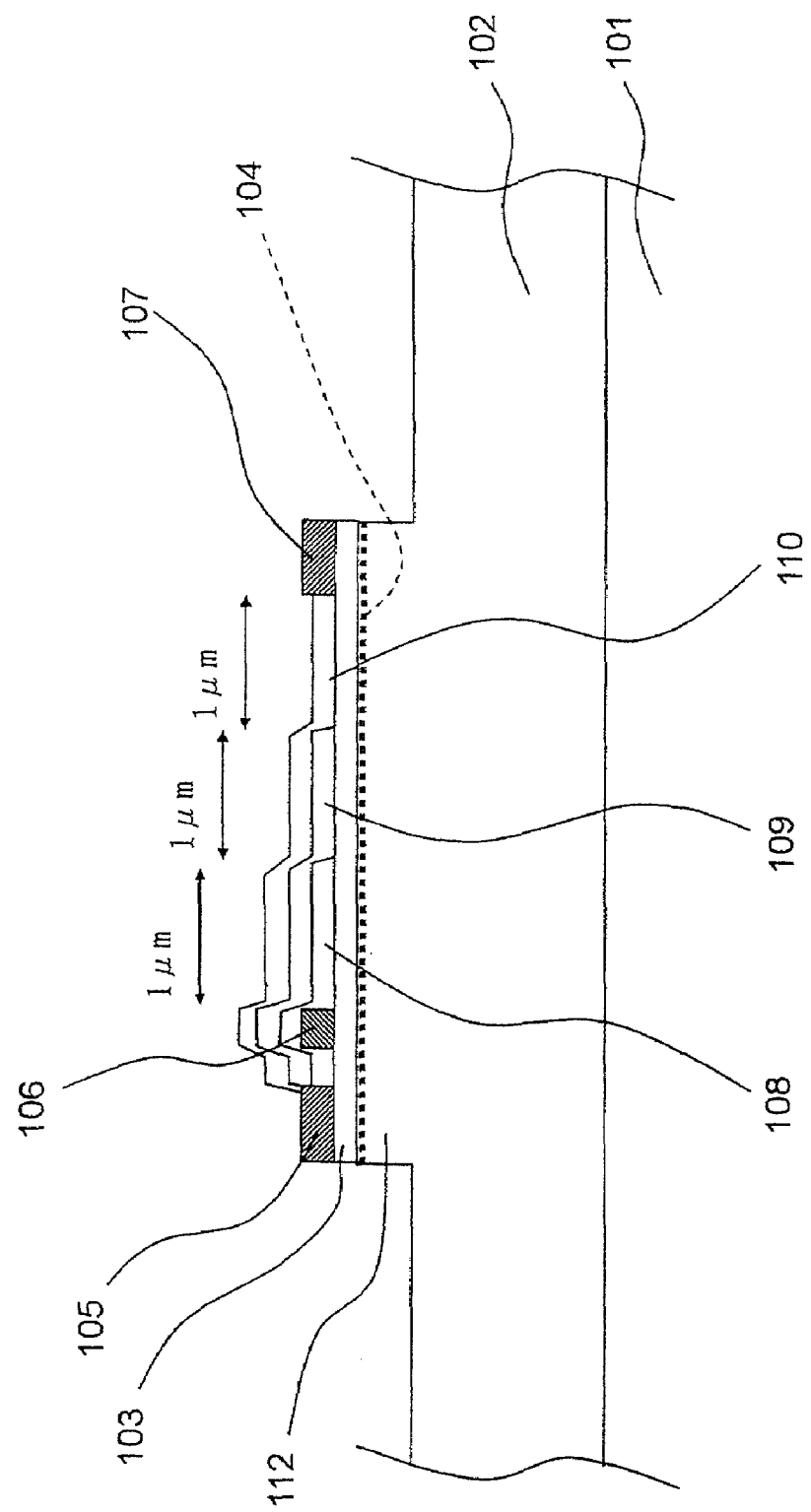
FIG. 1 is a sectional view of a heterojunction FET as one example of the electronic device according to a fifth embodiment of the present invention.

The electronic device and the heterojunction FET of the present invention will now be described in detail below by the embodiments shown in the drawings.

Before describing the embodiments, ideal grading of a dielectric layer is described.

When an electric potential change is one dimensional, the Maxwell equation is expressed as:

$$Ed\in/dx + \in dE/dx = \rho \quad \text{(Eq. 1)}$$

In an ideal case, there is no change in the electric field, and the differentiation dE/dx of the electric field is zero. Therefore, in the linear case, the dielectric constant of the dielectric layer should preferably be ideally changed as expressed as:

$$d\in/dx = \rho/E = \rho L/V \quad \text{(Eq. 2)}$$

In Equation (2), L represents an interval between the electrodes, and V represents an applied voltage.

When the electronic device is the GaN heterojunction FET, Equation (2) can express the greater detail. That is, in the GaN heterojunction FET, the region where the electric field is highest is located between the gate electrode and the drain electrode. Therefore, grading that changes the film thickness of the dielectric layer in the region located between the gate electrode and the drain electrode is effective.

In the GaN heterojunction FET, Equation (2) becomes expressed as:

$$\frac{d}{dx}\left(\int_0^t \in dy\right) \approx -q \cdot Ns \cdot Ldg / Vdg \quad \text{(Eq. 3)}$$

In Equation (3), y represents the vertical direction of the surface, Ns represents a sheet charge concentration, Ldg represents an interval between the drain electrode and the gate electrode, and Vdg represents a drain-gate voltage.

Therefore, when the dielectric constant of the dielectric layer is constant, a grading structure in which the thickness t(x) of the dielectric layer is ideally changed as:

$$dt(x)/dx = -q \cdot Ns \cdot Ldg / (\in \cdot Vdg) \quad \text{(Eq. 4)}$$

is formed.

On the other hand, when the thickness t of the dielectric is constant, a grading structure in which the dielectric constant ∈(x) is ideally changed as:

$$d\in(x)/dx = -q \cdot Ns \cdot Ldg / (Vdg \cdot t) \quad \text{(Eq. 5)}$$

is formed.

Equation (4) and Equation (5) are on the assumption that a dielectric of a high dielectric constant exerts the most intense influence on the electric field. In order to satisfy the assumption, it is required to satisfy the following two conditions.

(a) The dielectric constant ∈2 of the dielectric layer is higher than the dielectric constant ∈1 of the semiconductor layer located on the lower side.

(b) The product (∈2·t2) is greater than the product (∈1·t1), or the product (∈2·t2) is greater than the product (∈·Ldg) (t1: dielectric layer thickness, t2: semiconductor layer thickness).

Equation (3) can be integrated as:

$$\int_0^t \in dy \approx C - q \cdot Ns \cdot Ldg \cdot x / Vdg \quad \text{(Eq. 6)}$$

In Equation (6), C is a constant of integration. Since the dielectric layer must have positive thickness and dielectric constant, the following inequalities must hold:

$$C \geq +q \cdot Ns \cdot Ldg \cdot x / Vdg \mid_{x=Ldg} \quad \text{(Eq. 7)}$$

$$\therefore C \geq +q \cdot Ns \cdot Ldg^2 / Vdg \quad \text{(Eq. 8)}$$

$$\therefore \int_0^t \varepsilon dy \geq q \cdot Ns \cdot Ldg^2 / Vdg - q \cdot Ns \cdot Ldg \cdot x / Vdg \quad \text{(Eq. 9)}$$

In the case where the dielectric constant $\in$ is constant, Equation (9) is expressed as:

$$(\in \cdot t) \geq q \cdot Ns \cdot Ldg^2 / Vdg - q \cdot Ns \cdot Ldg x / Vdg \quad \text{(Eq. 10)}$$

Therefore, in order to achieve the ideal grading of the product ($\in \cdot t$) of the dielectric constant and the thickness of the dielectric layer, the maximum value of the product ($\in \cdot t$) must be greater or equal to the value $q \cdot Ns \cdot Ldg^2 / Vdg$. In the case of a commercial device, Vdg corresponds to the absolute maximum drain-gate voltage rating.

Practically, it is difficult to provide grading that ideally changes the thickness of the dielectric layer as in Equation (4) or grading that changes the dielectric constant as in Equation (5). However, the grading is effective when approximated to Equation (4) or Equation (5).

Next, a first embodiment of a grading structure in which the thickness of the dielectric layer is changed and a second embodiment of a grading structure in which the dielectric constant of the dielectric layer is changed, which are optimum grading structures highly effective for uniforming the electric field distribution between the electrodes are described.

First Embodiment

Figure 4:
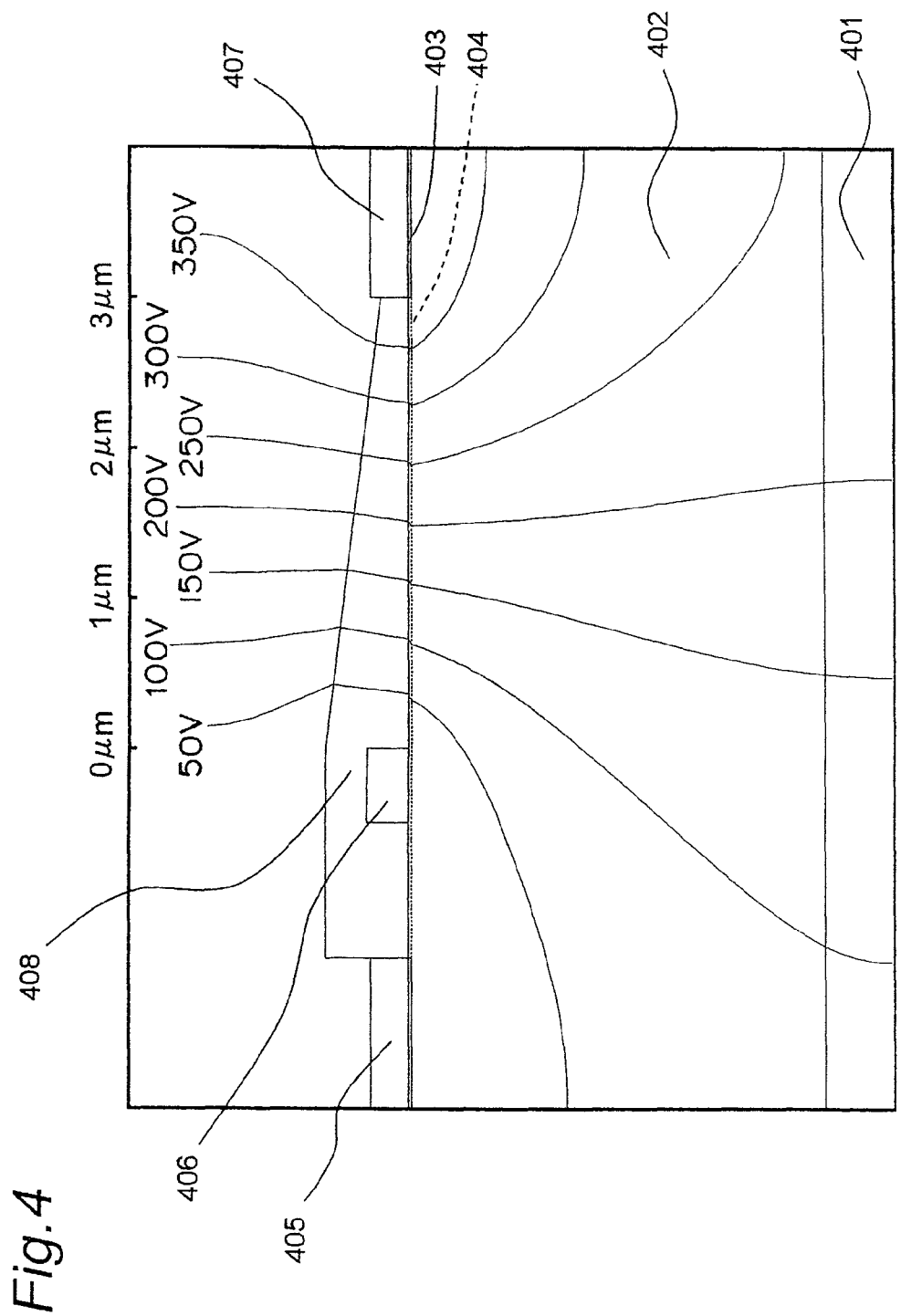
FIG. 4 is a sectional view showing the device structure and electrical potentials of a heterojunction FET as one example of the electronic device according to a first embodiment of the present invention.

FIG. 4 is a diagram that shows electrical potentials together with a sectional view of an AlGaN/GaN based heterojunction FET as one example of the electronic device of the first embodiment of the present invention and shows the effect of the grading structure in which the thickness of the dielectric layer is changed. Although the heterojunction FET has almost the same structure as that of FIG. 12, a grading structure in which the thickness of the dielectric layer is changed is formed on the semiconductor layer surface.

As shown in FIG. 4, a 3-μm thick GaN layer 402 made of undoped GaN and a 20-nm thick $Al_{0.5}Ga_{0.5}N$ layer 403 made of undoped $Al_{0.5}Ga_{0.5}N$ are formed on a sapphire substrate 401. A source ohmic electrode 405, a gate Schottky electrode 406 and a drain ohmic electrode 407 are formed on the $Al_{0.5}Ga_{0.5}N$ layer 403. The GaN layer 402 and the AlGaN layer 403 constitute an active layer.

A dielectric layer 408 made of a dielectric of a dielectric constant $\in r$ of 80 is formed on the $Al_{0.5}Ga_{0.5}N$ layer 403. The grading structure is formed by changing the thickness of the dielectric layer 408 from t(0)=600 nm to t(3 μm)=193 nm. Between the gate Schottky electrode 406 and the drain ohmic electrode 407, the degree of the grading is as expressed by Equation (4).

A 2DEG 404 is generated in a region at a boundary between the GaN layer 402 and the $Al_{0.5}Ga_{0.5}N$ layer 403. The 2DEG has a concentration of $8 \times 10^{12} \text{ cm}^{-2}$ in this case. In this case, the interval Ldg between the drain ohmic electrode 407 and the gate Schottky electrode 406 is 3 μm, the drain-source voltage Vds is 400 V, and the gate-source voltage Vgs is −10 V. In the case of the bias conditions, the heterojunction FET is in the off state (state in which the channel is depleted and no current flows).

In the heterojunction FET of the first embodiment, the uniformity of the electric field distribution is good when the grading structure in which the thickness of the dielectric layer 408 is changed is formed, and the maximum electric field is 3.34 MV/cm.

The heterojunction FET of the first embodiment has an effect similar to that of the heterojunction FET of the fifth embodiment.

According to the heterojunction FET of the first embodiment, by reducing the thickness of the dielectric layer from one electrode to the other so that the electric field is substantially uniformed, a dielectric layer that more reliably uniforms the electric field distribution between the electrodes can simply be formed.

Second Embodiment

Figure 5:
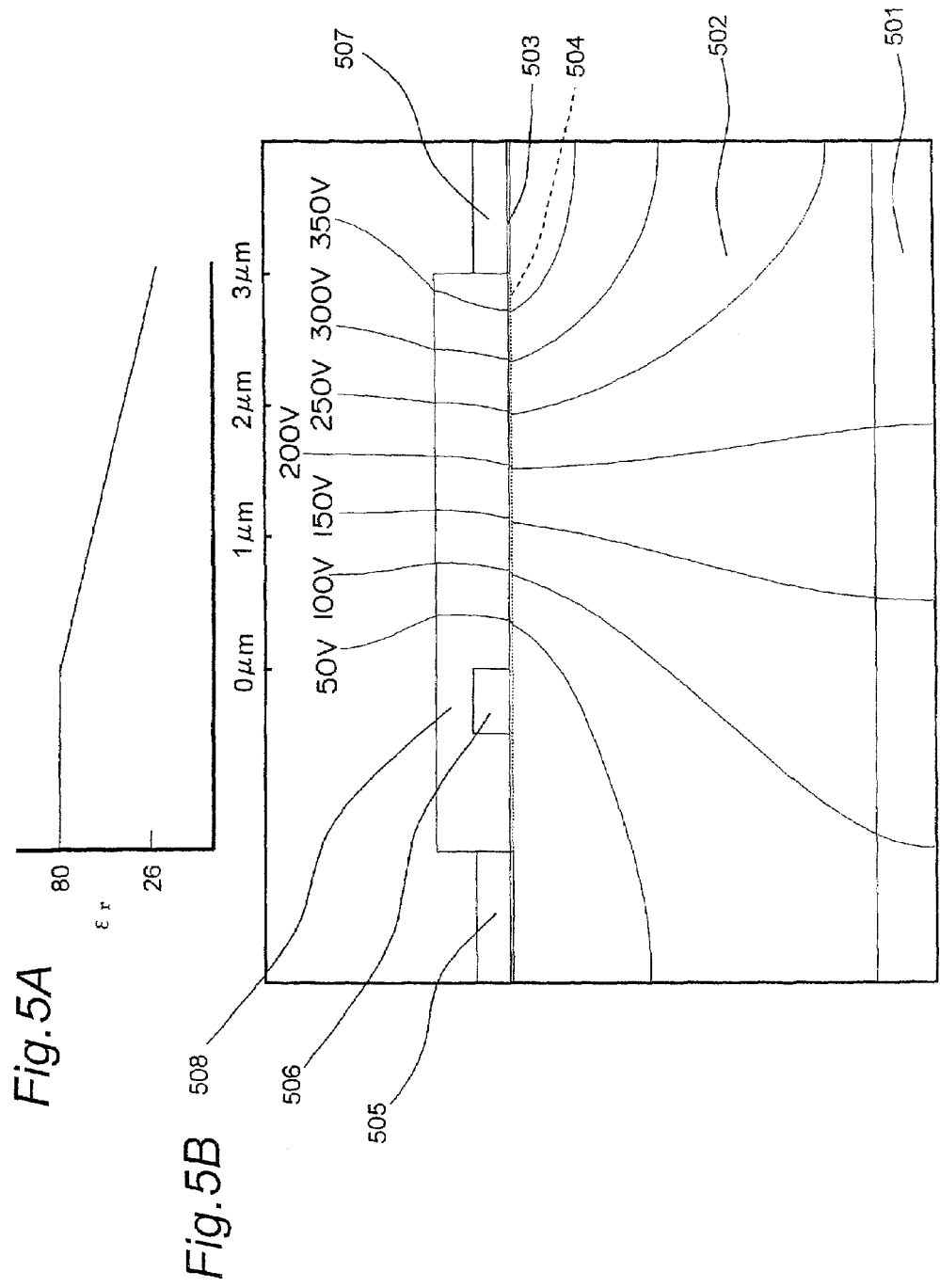
FIG. 5B is a sectional view showing the device structure and electrical potentials of a heterojunction FET as one example of the electronic device according to a second embodiment of the present invention.
FIG. 5A is a graph showing a change in the dielectric constant ∈r depending on the portion of the heterojunction FET.

FIG. 5B is a diagram that shows electrical potentials together with a sectional view of an AlGaN/GaN based heterojunction FET as one example of the electronic device of the second embodiment of the present invention and shows the effect of the grading structure in which the dielectric constant of the dielectric layer is changed. FIG. 5A shows a change in the dielectric constant $\in r$ depending on the portions of the heterojunction FET.

Figure 12:
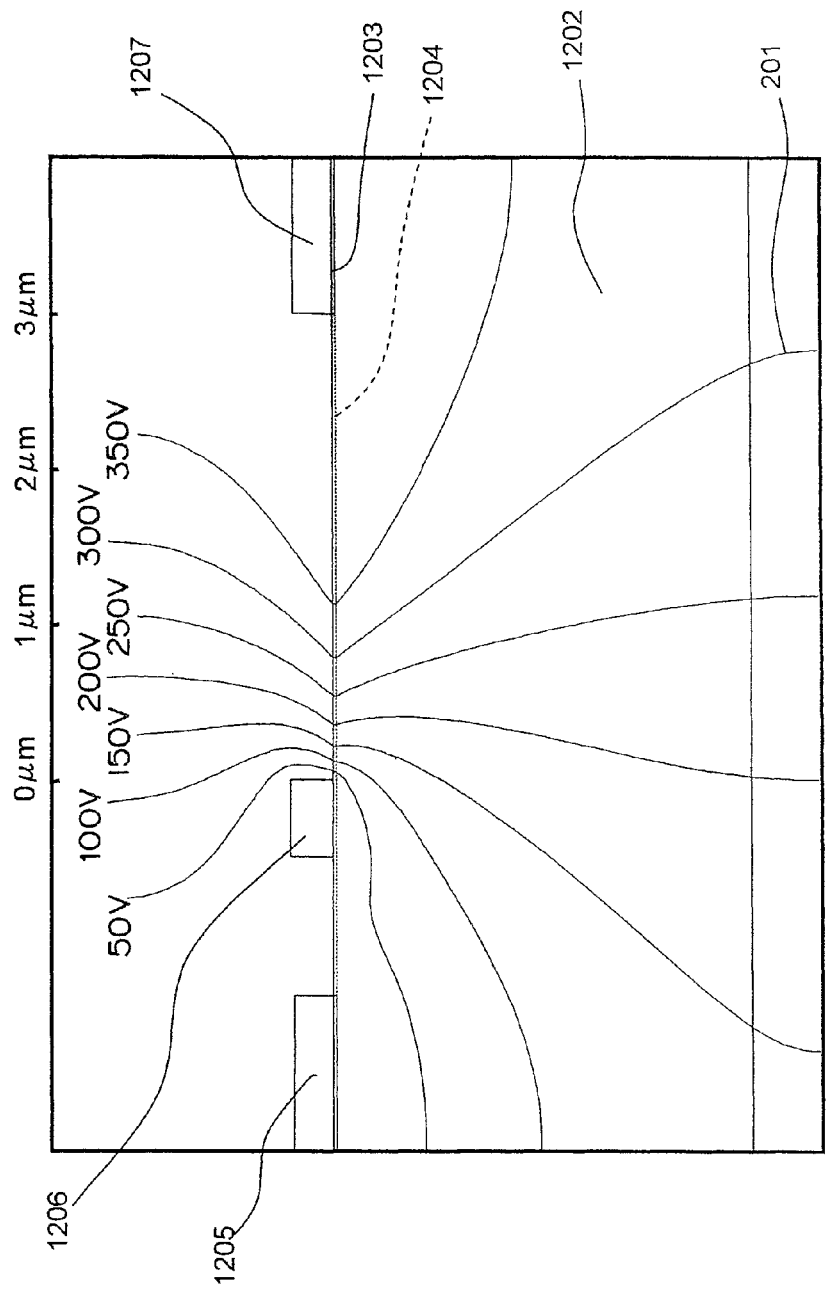
FIG. 12 is a sectional view showing the device structure and electrical potentials of the conventional heterojunction FET.

Although the structure of the heterojunction FET of the second embodiment is almost the same as that of FIG. 12, a dielectric layer in which the dielectric constant is changed is formed on the semiconductor layer surface.

As shown in FIG. 5B, a 3-μm thick GaN layer 502 made of undoped GaN and a 20-nm thick $Al_{0.5}Ga_{0.5}N$ layer 503 made of undoped $Al_{0.5}Ga_{0.5}N$ are formed on a sapphire substrate 501. A source ohmic electrode 505, a gate Schottky electrode 506 and a drain ohmic electrode 507 are formed on the $Al_{0.5}Ga_{0.5}N$ layer 503. The GaN layer 502 and the AlGaN layer 503 constitute an active layer.

A dielectric layer 508 made of a dielectric that has a thickness of 600 nm and a dielectric constant $\in r$ of 80 to 26 is formed on the $Al_{0.5}Ga_{0.5}N$ layer 503. A grading structure in which the dielectric constant of the dielectric layer 508 is changed from $\in r$ (0)=80 to $\in r$ (3 μm)=26 is formed. The degree of grading of the dielectric layer 508 between the gate Schottky electrode 506 and the drain ohmic electrode 507 is as expressed by Equation (5).

A 2DEG 504 is generated in a region at a boundary between the GaN layer 502 and the $Al_{0.5}Ga_{0.5}N$ layer 503. The 2DEG has a concentration of $8 \times 10^{12} \text{ cm}^{-2}$. In this case, the interval Ldg between the drain ohmic electrode 507 and the gate Schottky electrode 506 is 3 μm, the drain-source voltage Vds is 400 V, and the gate-source voltage Vgs is −10 V. In the case of the bias conditions, the heterojunction FET is in the off state (state in which the channel is depleted and no current flows).

In the heterojunction FET of the second embodiment, when the grading structure in which the thickness of the dielectric layer 508 is changed, the uniformity of the electric field distribution is good and the maximum electric field is 3.29 MV/cm.

The heterojunction FET of the second embodiment has an effect similar to that of the heterojunction FET of the fifth embodiment.

According to the heterojunction FET of the second embodiment, by reducing the dielectric constant of the dielectric layer from one toward the other of the electrodes between which the electric field is substantially uniformed, a stepwise dielectric layer that more reliably uniforms the electric field distribution between the electrodes can simply be formed.

Third Embodiment

The third embodiment, in which a dielectric of which the thickness and the dielectric constant are constant and high is formed onto an electronic device, is described. The third embodiment is effective although it is not optimum in uniforming the electric field distribution between the electrodes.

Figure 6:
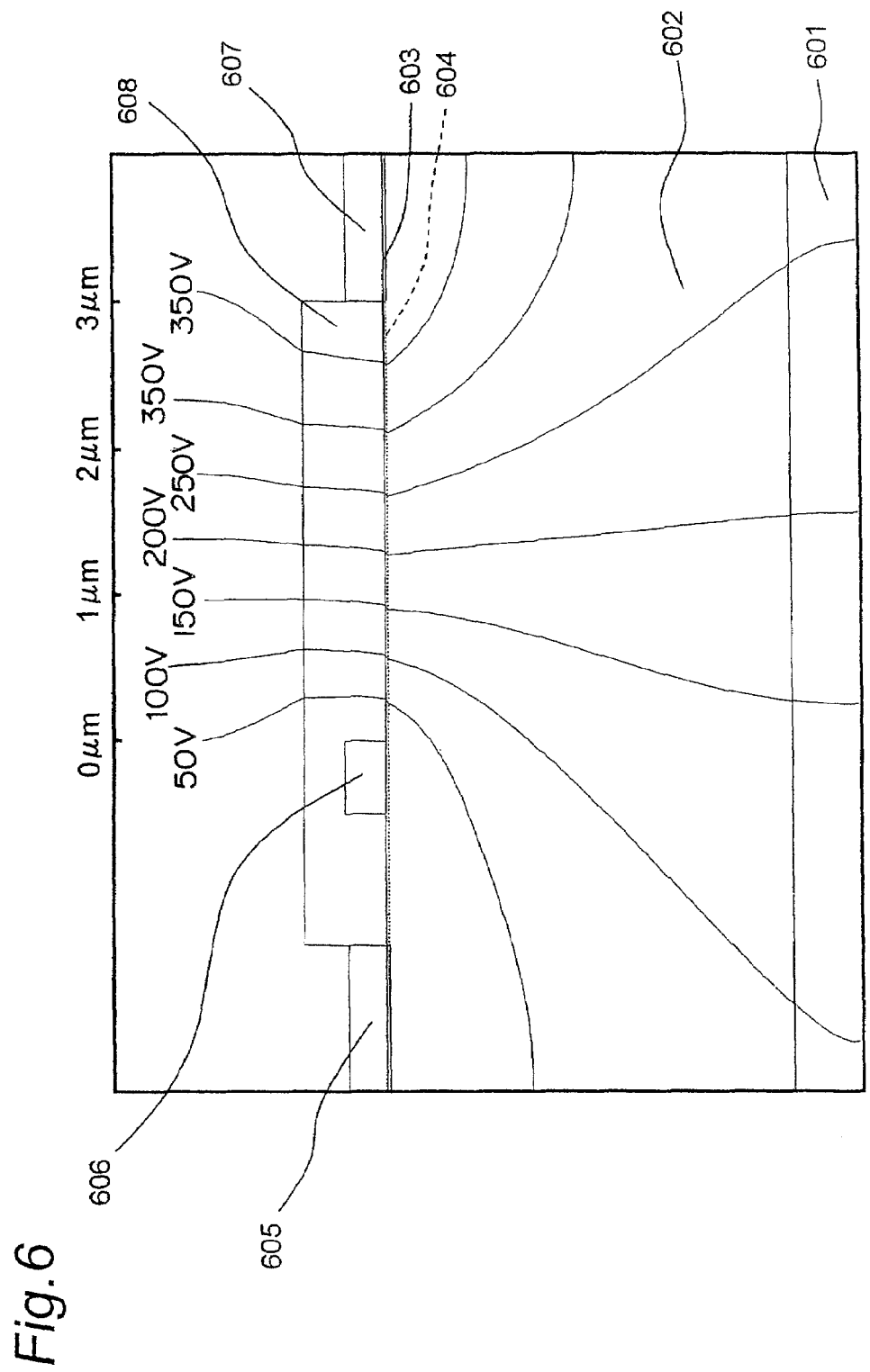
FIG. 6 is a sectional view showing the device structure and electrical potentials of a heterojunction FET as one example of the electronic device according to a third embodiment of the present invention.

FIG. 6 is a diagram that shows electrical potentials together with a sectional view of an AlGaN/GaN based heterojunction FET as one example of the electronic device of the third embodiment of the present invention. Although the heterojunction FET has almost the same structure as that of FIG. 12, a dielectric layer of a high dielectric constant is formed on the semiconductor layer surface.

As shown in FIG. 6, a 3-μm thick GaN layer 602 made of undoped GaN and a 20-nm thick $Al_{0.5}Ga_{0.5}N$ layer 603 made of undoped $Al_{0.5}Ga_{0.5}N$ are formed on a sapphire substrate 601. A source ohmic electrode 605, a gate Schottky electrode 606 and a drain ohmic electrode 607 are formed on the $Al_{0.5}Ga_{0.5}N$ layer 603. The GaN layer 602 and the AlGaN layer 603 constitute an active layer.

A dielectric layer 608 made of a dielectric that has a thickness of 600 nm and a dielectric constant ∈r of 80 is formed on the $Al_{0.5}Ga_{0.5}N$ layer 603. A 2DEG 604 is generated in a region at a boundary between the GaN layer 602 and the $Al_{0.5}Ga_{0.5}N$ layer 603. The 2DEG has a concentration of $8\times10^{12}$ $cm^{-2}$ in this case. In this case, the interval Ldg between the drain ohmic electrode 607 and the gate Schottky electrode 606 is 3 μm, the drain-source voltage Vds is 400 V, and the gate-source voltage Vgs is −10 V. In the case of the bias conditions, the heterojunction FET is in the off state (state in which the channel is depleted and no current flows).

It can be understood that the uniformity of the electric field distribution is good when the dielectric layer 608 of a high dielectric constant is formed at the heterojunction FET of the third embodiment. In the case of FIG. 6, the maximum electric field is 3.73 MV/cm.

According to the heterojunction FET of the construction, by employing a dielectric of a high dielectric constant for the dielectric layer 608 formed on the active layer constructed of the GaN layer 602 and the AlGaN layer 603, it is easy to substantially uniform the electric field distribution between the gate Schottky electrode 606 and the drain ohmic electrode 607 formed on the active layer. Therefore, a high withstand voltage can be achieved by uniforming the electric field distribution between the electrodes with a simple construction without employing the field plate structure for shielding the electric field.

Moreover, by making the dielectric constant ∈2 of the dielectric layer higher than the dielectric constant ∈1 of the active layer, the electric field distribution between the gate Schottky electrode 606 and the drain ohmic electrode 607 can easily be uniformed.

First Comparative Example

Figure 7:
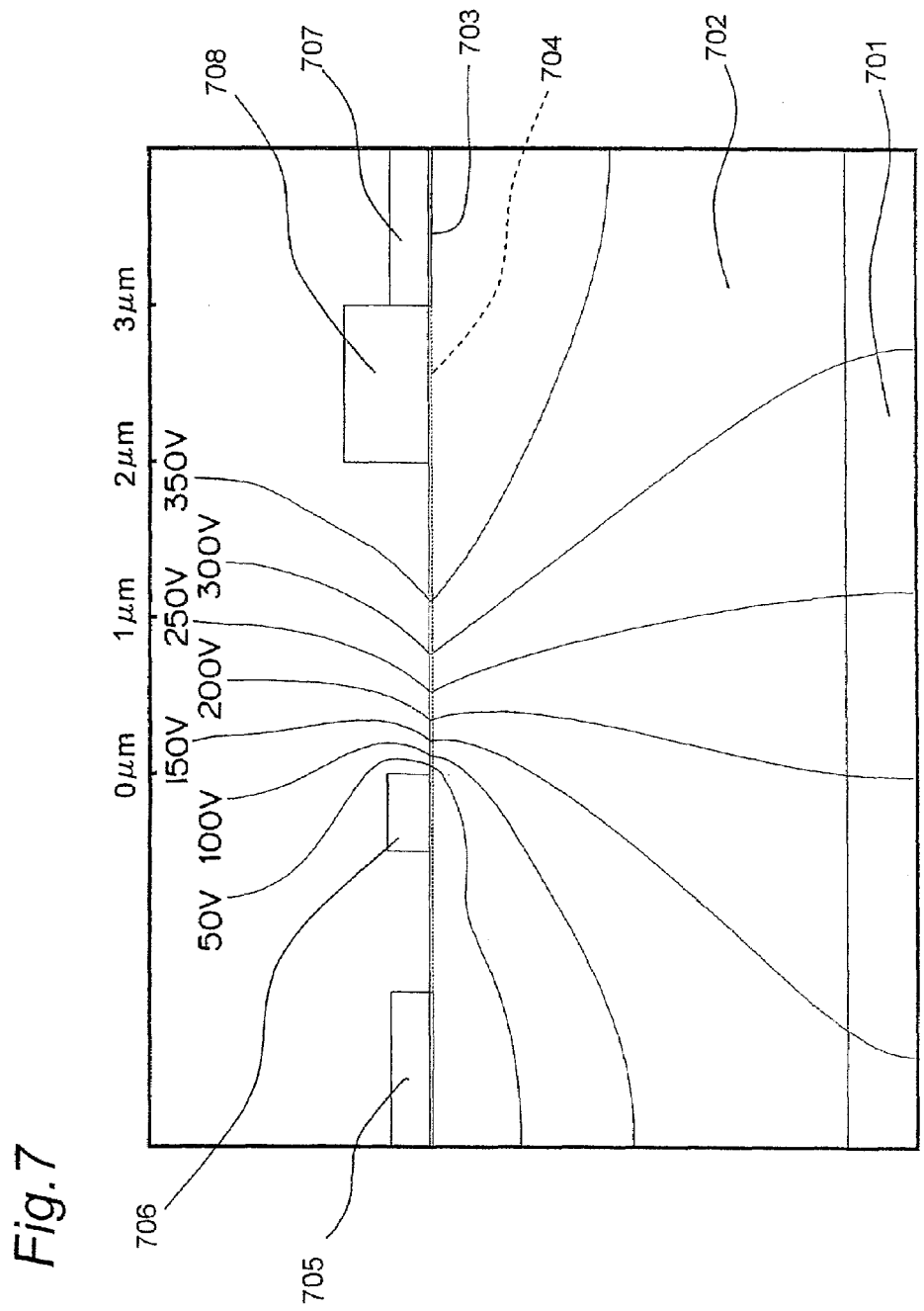
FIG. 7 is a sectional view showing the exemplified device structure and electrical potentials of a heterojunction FET as one example of the electronic device according to a first comparative example of the present invention.

FIG. 7 is a diagram that shows electrical potentials together with a sectional view of an AlGaN/GaN based heterojunction FET of the first comparative example. Although the structure of the heterojunction FET is almost the same as that of FIG. 12, a dielectric layer of a high dielectric constant is formed on the semiconductor layer surface only in a region near the drain electrode.

As shown in FIG. 7, a 3-μm thick GaN layer 702 made of undoped GaN and a 20-nm thick $Al_{0.5}Ga_{0.5}N$ layer 703 made of undoped $Al_{0.5}Ga_{0.5}N$ are formed on a sapphire substrate 701. A source ohmic electrode 705, a gate Schottky electrode 706 and a drain ohmic electrode 707 are formed on the $Al_{0.5}Ga_{0.5}N$ layer 703. The GaN layer 702 and the AlGaN layer 703 constitute an active layer.

A dielectric layer 708 made of a dielectric that has a thickness of 600 nm, a width of 1 μm and a dielectric constant ∈r of 80 is formed on the $Al_{0.5}Ga_{0.5}N$ layer 703. A 2DEG 704 is generated in a region at a boundary between the GaN layer 702 and the $Al_{0.5}Ga_{0.5}N$ layer 703. The 2DEG has a concentration of $8\times10^{12}$ $cm^{-2}$ in this case. In this case, the interval Ldg between the drain ohmic electrode 707 and the gate Schottky electrode 706 is 3 μm, the drain-source voltage Vds is 400 V, and the gate-source voltage Vgs is −10 V. In the case of the bias conditions, the heterojunction FET is in the off state (state in which the channel is depleted and no current flows).

If FIG. 7 is compared with FIG. 12, it can be understood that the uniformity of the electric field is slightly degraded when the dielectric layer 708 of a high dielectric constant is formed only in the region near the drain electrode on the semiconductor layer surface. The maximum electric field is 9.50 MV/cm in the case of FIG. 7.

Second Comparative Example

Figure 8:
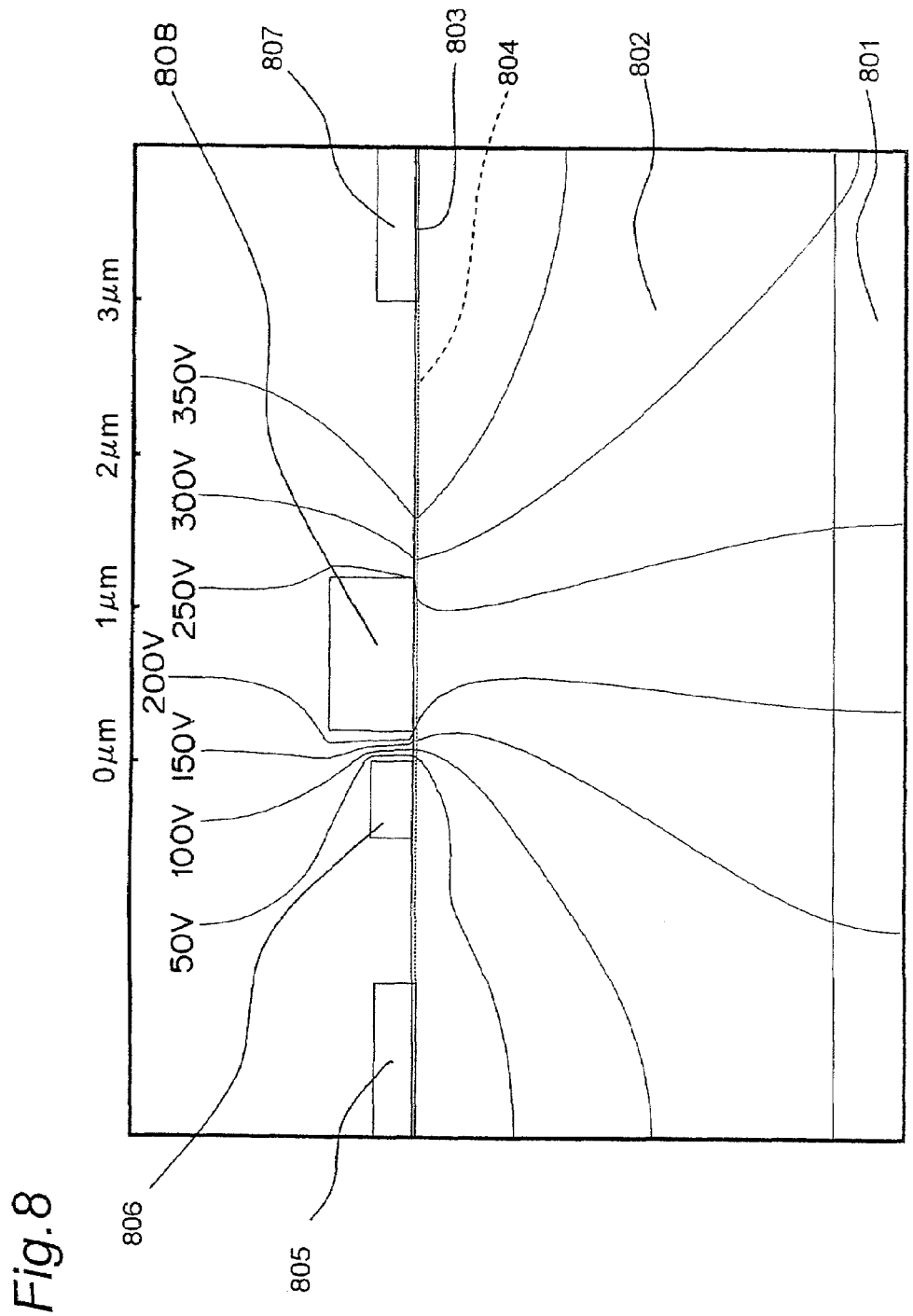
FIG. 8 is a sectional view showing the exemplified device structure and electrical potentials of a heterojunction FET as one example of the electronic device according to a second comparative example of the present invention.

FIG. 8 is a diagram that shows electrical potentials together with a sectional view of an AlGaN/GaN based heterojunction FET of the second comparative example. Although the heterojunction FET has almost the same structure as that of FIG. 12, a dielectric layer 808 of a high dielectric constant is provided only in a region near the gate electrode on the semiconductor layer surface. There is a gap of 0.3 μm between the dielectric layer and the gate electrode.

As shown in FIG. 8, a 3-μm thick GaN layer 802 made of undoped GaN and a 20-nm thick $Al_{0.5}Ga_{0.5}N$ layer 803 made of undoped $Al_{0.5}Ga_{0.5}N$ are formed on a sapphire substrate 801. A source ohmic electrode 805, a gate Schottky electrode 806 and a drain ohmic electrode 807 are formed on the $Al_{0.5}Ga_{0.5}N$ layer 803. The GaN layer 802 and the AlGaN layer 803 constitute an active layer.

A dielectric layer 808 made of a dielectric that has a thickness of 600 nm, a width of 1 μm and a dielectric constant ∈r of 80 is formed on the $Al_{0.5}Ga_{0.5}N$ layer 803. A 2DEG 804 is generated in a region at a boundary between the GaN layer 802 and the $Al_{0.5}Ga_{0.5}N$ layer 803. The 2DEG has a concentration of $8\times10^{12}$ $cm^{-2}$ in this case. In this case, the interval Ldg between the drain ohmic electrode 807 and the gate Schottky electrode 806 is 3 μm, the drain-source voltage Vds is 400 V, and the gate-source voltage Vgs is −10 V. In the case of the bias conditions, the device is in the off state (state in which the channel is depleted and no current flows).

If FIG. 8 is compared with FIG. 12, it can be understood that the uniformity of the electric field distribution is degraded when the dielectric layer 808 of a high dielectric constant is formed only in the region near the gate Schottky electrode 806 on the semiconductor layer surface of the active layer providing a gap between the dielectric layer 808 and the gate Schottky electrode 806. The maximum electric field is 13.47 MV/cm in the case of FIG. 8.

Fourth Embodiment

Figure 9:
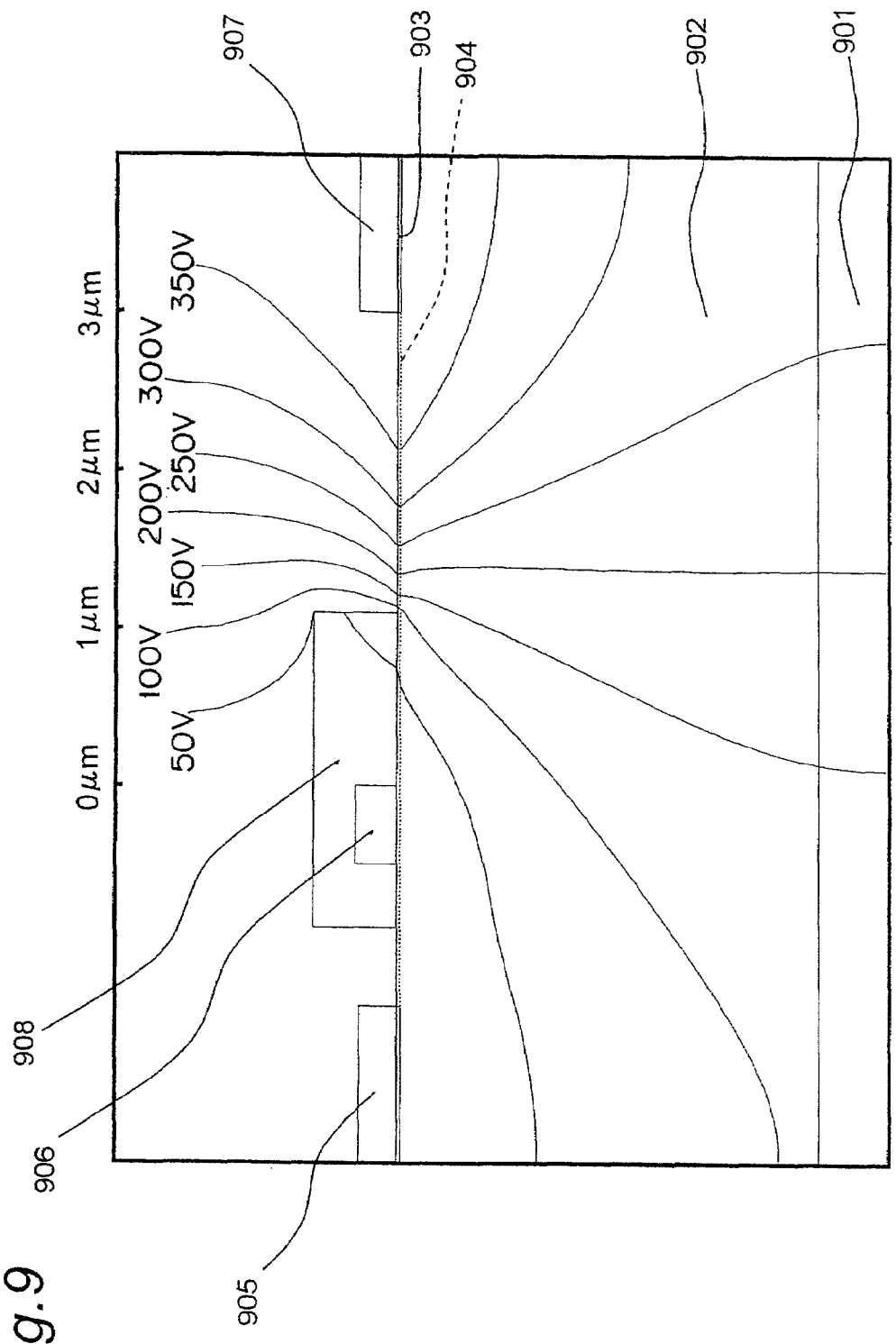
FIG. 9 is a sectional view showing the exemplified device structure and electrical potentials of a heterojunction FET as one example of the electronic device according to a fourth embodiment of the present invention.

A dielectric layer of a high dielectric constant sometimes exerts an intense influence on the electric field distribution even if the layer is formed between the electrodes only partially on the semiconductor layer surface. FIG. 9 is a diagram showing the effect of the formation of the dielectric layer only partially on the semiconductor layer surface.

FIG. 9 is a diagram that shows electrical potentials together with a sectional view of an AlGaN/GaN based heterojunction FET as one example of the electronic device of the fourth embodiment of the present invention. Although the heterojunction FET has almost the same structure as that of FIG. 12, a dielectric layer of a high dielectric constant is formed only in a region that surrounds the gate electrode on the semiconductor layer surface.

As shown in FIG. 9, a 3-μm thick GaN layer 902 made of undoped GaN and a 20-nm thick $Al_{0.5}Ga_{0.5}N$ layer 903 made of undoped $Al_{0.5}Ga_{0.5}N$ are formed on a sapphire substrate 901. A source ohmic electrode 905, a gate Schottky electrode 906 and a drain ohmic electrode 907 are formed on the $Al_{0.5}Ga_{0.5}N$ layer 903. The GaN layer 902 and the AlGaN layer 903 constitute an active layer.

A dielectric layer 908 made of a dielectric that has a thickness of 600 nm, a width of 2 μm and a dielectric constant $\in r$ of 80 is formed on the $Al_{0.5}Ga_{0.5}N$ layer 903. A 2DEG 904 is generated in a region at a boundary between the GaN layer 902 and the $Al_{0.5}Ga_{0.5}N$ layer 903. The 2DEG has a concentration of $8 \times 10^{12}$ $cm^{-2}$ in this case. In this case, the interval Ldg between the drain ohmic electrode 907 and the gate Schottky electrode 906 is 3 μm, the drain-source voltage Vds is 400 V, and the gate-source voltage Vgs is −10 V. In the case of the bias conditions, the heterojunction FET is in the off state (state in which the channel is depleted and no current flows).

If FIG. 9 is compared with the first and second comparative examples of FIGS. 7 and 8, the uniformity of the electric field distribution is improved when the dielectric layer 908 of a high dielectric constant is formed only in the region that surrounds the gate Schottky electrode 906 on the semiconductor layer surface. The maximum electric field is 6.45 MV/cm.

Fifth Embodiment

FIG. 1 is a diagram showing a sectional view of an AlGaN/GaN based heterojunction FET as one example of the electronic device of the fifth embodiment of the present invention.

In the heterojunction FET of the fifth embodiment, a dielectric layer of a stepwise laminate structure in which the number of layers is varied step by step is formed by layering a $TiO_2$ layer three times. A change in the thickness of the dielectric layer of the stepwise laminate structure is approximated to the grading structure in which the thickness of the dielectric layer is changed as expressed by Equation (4). The heterojunction FET shown in FIG. 1 is a structure capable of enduring a maximum drain-gate voltage Vdg of 410 V. The interval Ldg between the drain ohmic electrode 107 and the gate Schottky electrode 106 is 3 μm.

A method for manufacturing the heterojunction FET is generally as follows.

First of all, a GaN layer 102 and an AlGaN layer 103 are successively grown on a sapphire substrate 101. As a crystal growth method in this case, the MBE (Molecular Beam Epitaxy) method or the MOCVD (Metal-Organic Chemical Vapor Deposition) method is effective. The GaN layer 102 and the AlGaN layer 103 constitute an active layer.

Next, an isolation mesa 112 is formed by dry etching.

Next, a source ohmic electrode 105 and a drain ohmic electrode 107 are formed on the AlGaN layer 103 and subjected to heat treatment so that the contact resistance is reduced.

Next, a gate Schottky electrode 106 is formed on the AlGaN layer 103.

Next, a $TiO_2$ layer 108 is formed by depositing a $TiO_2$ layer on the entire surface and carrying out patterning by wet etching. Sputtering or a spin-on process is effective as a deposition method. In the case of the spin-on process, the heat treatment is carried out after the deposition.

Next, a $TiO_2$ layer 109 is formed by depositing a $TiO_2$ layer on the entire surface and carrying out patterning by wet etching. A $TiO_2$ layer 110 is formed by depositing a $TiO_2$ layer on the entire surface and carrying out patterning by wet etching.

The total thickness of the $TiO_2$ layers 108, 109 and 110 is changed in three steps (width of each step is 1 μm) between the gate Schottky electrode 106 and the drain ohmic electrode 107 in the fifth embodiment. Therefore, the $TiO_2$ layers 108, 109 and 110 are approximated to the grading structure of Equation (4).

The $TiO_2$ layer 108, the $TiO_2$ layer 109 and the $TiO_2$ layer 110 constitute a dielectric layer of the stepwise laminate structure. The substance of $TiO_2$, which has a high dielectric constant $\in r$ of 80 and a high breakdown electric field of 7 MV/cm, is therefore an appropriate dielectric to be used for the present invention.

In contrast to the fact that the withstand voltage of the conventional heterojunction FET shown in FIG. 12 is 111 V by simulation, the heterojunction FET shown in FIG. 1 of the fifth embodiment has a high withstand voltage of 743 V. Since both of them have the same 2DEG concentration and electron mobility, the channel resistance is the same.

According to the heterojunction FET of the construction, by using $TiO_2$ as a dielectric of a high dielectric constant for the dielectric layers ($TiO_2$ layers 108, 109 and 110) formed on the active layer constructed of the GaN layer 102 and the AlGaN layer 103, it is easy to substantially uniform the electric field distribution between the gate Schottky electrode 106 and the drain ohmic electrode 107 formed on the active layer. Therefore, a high withstand voltage can be achieved by uniforming the electric field distribution between the electrodes with a simple construction without employing the field plate structure for shielding the electric field.

Moreover, by making the dielectric constant of $TiO_2$ of the dielectric layer higher than the dielectric constant of GaN and AlGaN of the active layer, the electric field distribution between the gate Schottky electrode 106 and the drain ohmic electrode 107 can easily be uniformed.

Moreover, by virtue of the electric field distribution substantially uniformed by reducing step by step the sum of the products of the thickness and the dielectric constant of each of the $TiO_2$ layers that constitute the dielectric layers ($TiO_2$ layers 108, 109 and 110) of the stepwise laminate structure from the gate Schottky electrode 106 toward the drain ohmic electrode 107, a stepwise dielectric layer that more reliably uniforms the electric field distribution between the electrodes can simply be formed.

Moreover, in the heterojunction FET in which a group III nitride based compound semiconductor is used for the active layer, the field plate structure is not effective, and the effect by uniforming the electric field distribution by the dielectric layer is particularly remarkable.

Moreover, a dielectric layer of a high dielectric constant can easily be formed by containing $TiO_2$ that is the metal oxide in the dielectric layer.

Moreover, since the heterojunction FET of the fifth embodiment employs the group III nitride based compound semiconductor that produces an intense piezoelectric effect for the active layer, it is possible that a stress is generated on the surface of the active layer and causes a change in the concentration of the 2DEG. Since the change in the concentration of the 2DEG is not desirable in terms of the electronic device characteristics, the dielectric layer should preferably be formed so that no stress is applied to the semiconductor of the active layer.

Sixth Embodiment

Figure 2:
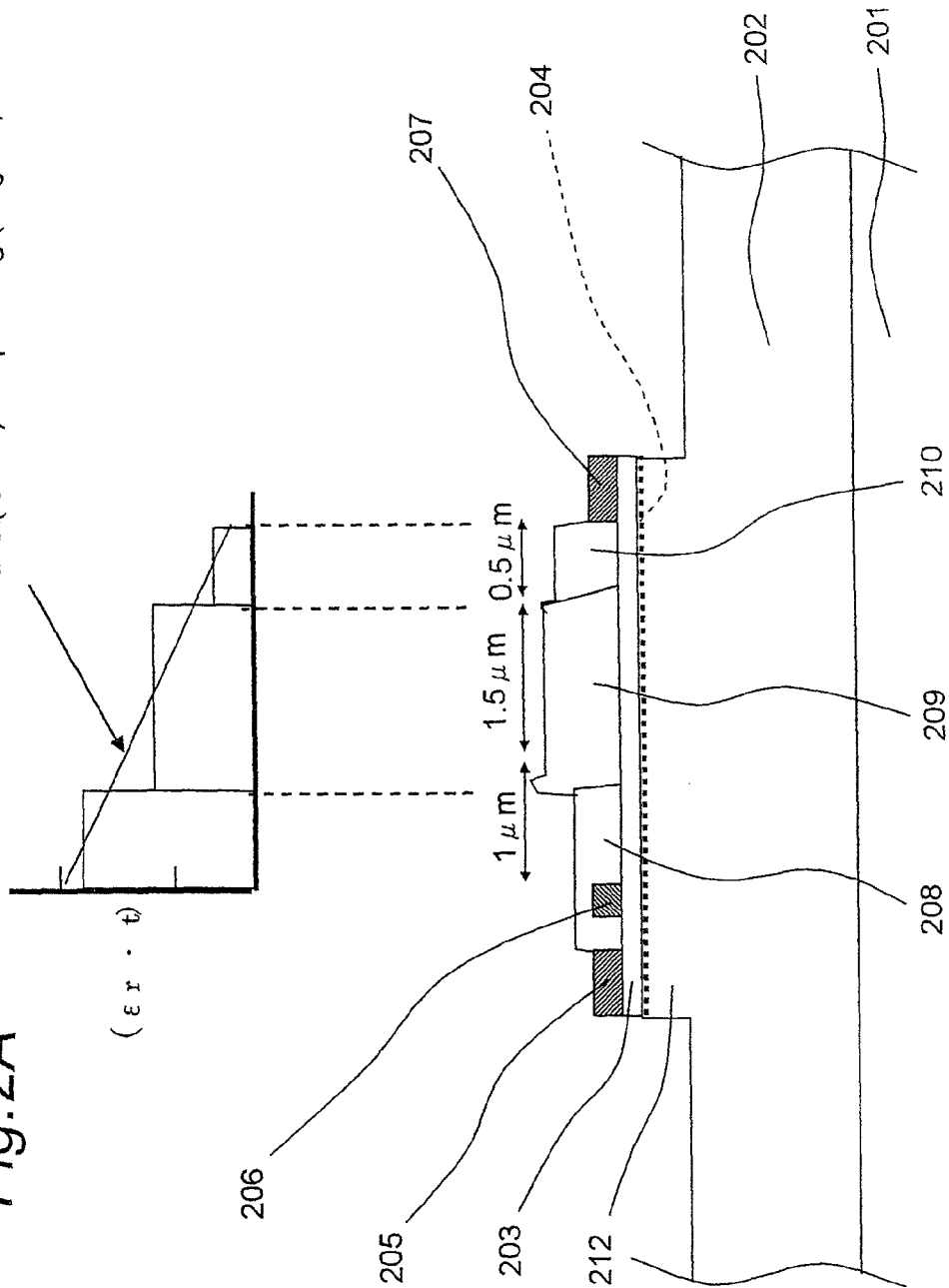
FIG. 2B is a sectional view of the heterojunction FET as one example of the electronic device according to a sixth embodiment of the present invention.
FIG. 2A is a graph showing a change in the product (∈r·t) of the dielectric constant and the thickness depending on the portion of the heterojunction FET.

FIG. 2B is a diagram showing a sectional view of the AlGaN/GaN based heterojunction FET as one example of the electronic device of the sixth embodiment of the present invention.

In the heterojunction FET of the sixth embodiment, the dielectric layer is formed by combining dielectric layers of three kinds, and the change in the dielectric constant of the combined dielectric layer is approximated to the grading structure of which the dielectric constant is changed as expressed by Equation (3). FIG. 2A shows a change in the product ($\in r \cdot t$) of the dielectric constant and the thickness depending on the portions of the heterojunction FET. The heterojunction FET shown in FIG. 2B has a structure capable of enduring the maximum drain-gate voltage Vdg of 410 V. The interval Ldg between the drain electrode 207 and the gate electrode 206 is 3 μm.

A method for manufacturing the heterojunction FET is generally as follows.

As shown in FIG. 2B, a GaN layer 202 and an AlGaN layer 203 are successively grown on a sapphire substrate 201. In this case, the MBE method or the MOCVD method is effective as a crystal growth method. The GaN layer 202 and the AlGaN layer 203 constitute an active layer.

Next, an isolation mesa 212 is formed by dry etching.

Next, a source electrode 205 and a drain electrode 207 are formed on the AlGaN layer 203 and subjected to heat treatment so that the contact resistance is reduced.

Next, a gate Schottky electrode 206 is formed on the AlGaN layer 203.

Next, a TiO$_2$ layer is deposited on the entire surface, and patterning is carried out by wet etching, forming a TiO$_2$ layer 208. Sputtering or a spin-on process is effective as a deposition method. In the case of the spin-on process, the heat treatment is carried out after the deposition.

Next, an HfO$_2$ layer 209 is formed by depositing an HfO$_2$ layer on the entire surface by sputtering and carrying out patterning by wet etching, and an SiN$_2$ layer 210 is formed by depositing an SiN$_2$ layer on the entire surface by CVD and carrying out patterning by wet etching.

The TiO$_2$ layer 208, the HfO$_2$ layer 209 and the SiN$_2$ layer 210 constitute a dielectric layer. The TiO$_2$ layer 208 has a width of 1 μm, the HfO$_2$ layer 209 has a width of 1.5 μm and the SiN$_2$ layer 210 has a width of 0.5 μm.

In the heterojunction FET of the sixth embodiment, the dielectric constant and the thickness of the whole dielectric layer, which are changed in three steps between the gate Schottky electrode 206 and the drain electrode 207, are therefore approximated to the grading structure of Equation (3). The dielectric constant $\in r$, the thickness t and the product ($\in r \cdot t$) of the dielectric used for the dielectric layer of the sixth embodiment are as follows.

TiO$_2$: $\in r=80$, t=345 nm, ($\in r \cdot t$)=2.76×10$^{-3}$ cm
HfO$_2$: $\in r=25$, t=561 nm, ($\in r \cdot t$)=1.40×10$^{-3}$ cm
SiN$_2$: $\in r=7.5$, t=425 nm, ($\in r \cdot t$)=0.32×10$^{-3}$ cm In this case, a slope d/dx($\in r \cdot t$) of the approximated straight line of the graph of FIG. 2A is expressed as:

$$d/dx(\in r \cdot t) = -q \cdot Ns \cdot Ldg/(Vdg \cdot \in 0) = -10.6$$

(where $\in 0$ represents the dielectric constant of vacuum).

The heterojunction FET of the sixth embodiment has an effect similar to that of the heterojunction FET of the fifth embodiment.

Seventh Embodiment

Figure 3:
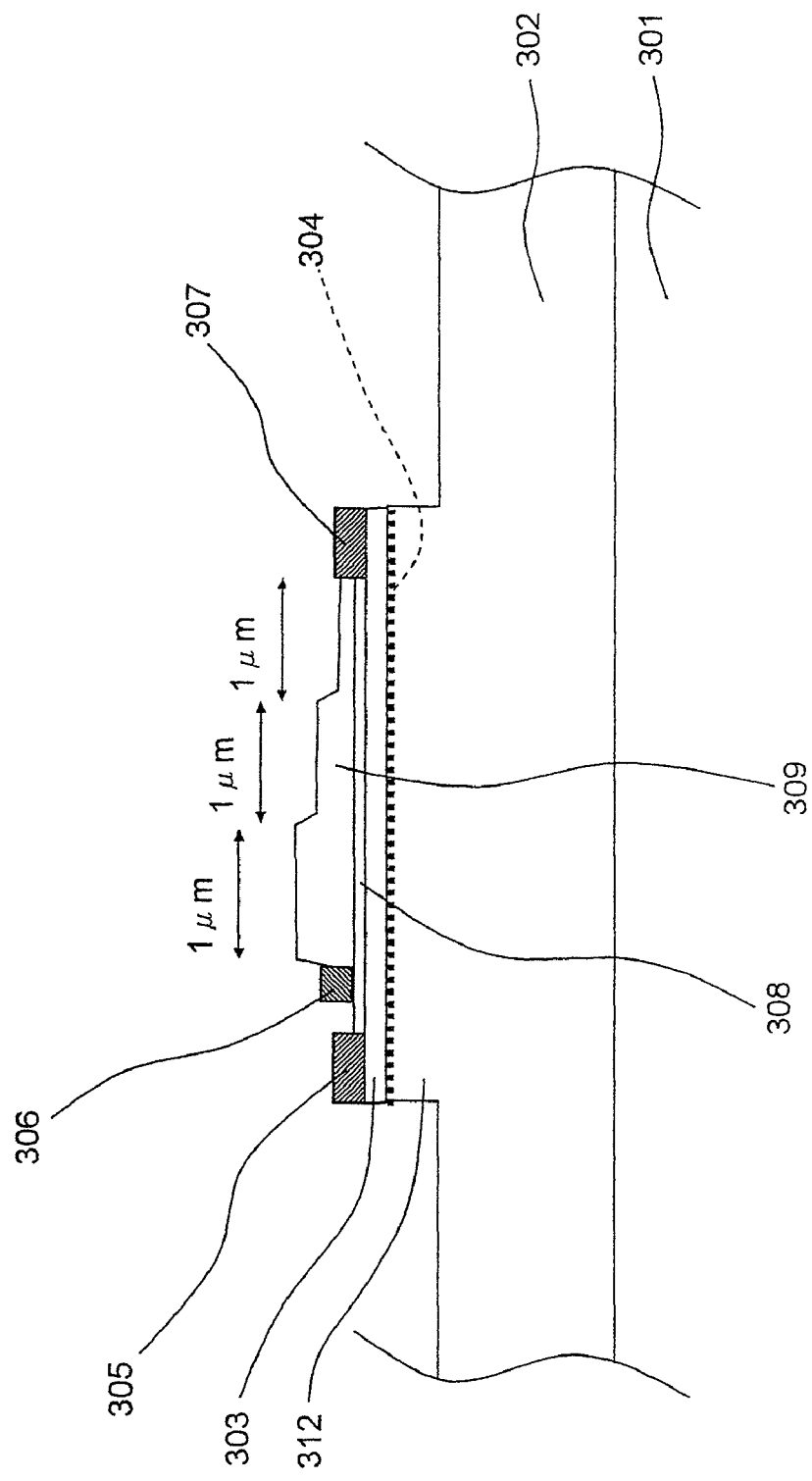
FIG. 3 is a sectional view of a heterojunction FET as one example of the electronic device according to a seventh embodiment of the present invention.

FIG. 3 shows a sectional view of an AlGaN/GaN based heterojunction FET as one example of the electronic device of the seventh embodiment of the present invention. In the heterojunction FET of the seventh embodiment, a thin passivation layer 308 made of SiN$_2$ is interposed between a dielectric layer of a high dielectric constant and a semiconductor layer. The passivation layer 308 of SiN$_2$ is intended to stabilize the AlGaN layer 303. Since the passivation layer 308 of SiN$_2$ is made thin, the effect of the dielectric layer on it is scarcely reduced.

The seventh embodiment employs an MIS (Metal-Insulator-Semiconductor) gate electrode in place of the gate Schottky electrode. Moreover, the gate insulator is the passivation layer 308 of SiN$_2$.

The heterojunction FET shown in FIG. 3 has a structure capable of enduring the maximum drain-gate voltage Vdg of 410 V. The interval Ldg between the drain electrode 307 and the gate Schottky electrode 306 is 3 μm.

A method for manufacturing the heterojunction FET is as follows.

First of all, a GaN layer 302 and an AlGaN layer 303 are successively grown on a sapphire substrate 301. The MBE method or the MOCVD method is effective as a crystal growth method in this case. The GaN layer 302 and the AlGaN layer 303 constitute an active layer.

Next, an isolation mesa 312 is formed by dry etching.

Next, a source electrode 305 and a drain electrode 307 are formed on the AlGaN layer 303 and subjected to heat treatment so that the contact resistance is reduced.

Next, the SiN$_2$ layer 308 is deposited on the entire surface by CVD, and patterning is carried out by wet etching.

Next, the gate electrode 306 is formed on the SiN$_2$ layer 308.

Next, a TiO$_2$ layer 309 is formed by depositing a TiO$_2$ layer on the entire surface and repeating the wet etching process three times, and a dielectric layer of a grading structure in which the thickness of the TiO$_2$ layer 309 is varied in three steps is formed.

In detail, a portion of the TiO$_2$ layer is etched by a thickness of about 135 nm by the first wet etching. Next, another portion of the TiO$_2$ layer is further etched by about 135 nm by the second wet etching. Finally, the TiO$_2$ layer 309 is formed by further etching another portion of the TiO$_2$ layer by about 135 nm by the third wet etching.

The heterojunction FET of the seventh embodiment has an effect similar to that of the heterojunction FET of the fifth embodiment.

Eighth Embodiment

Figure 10:
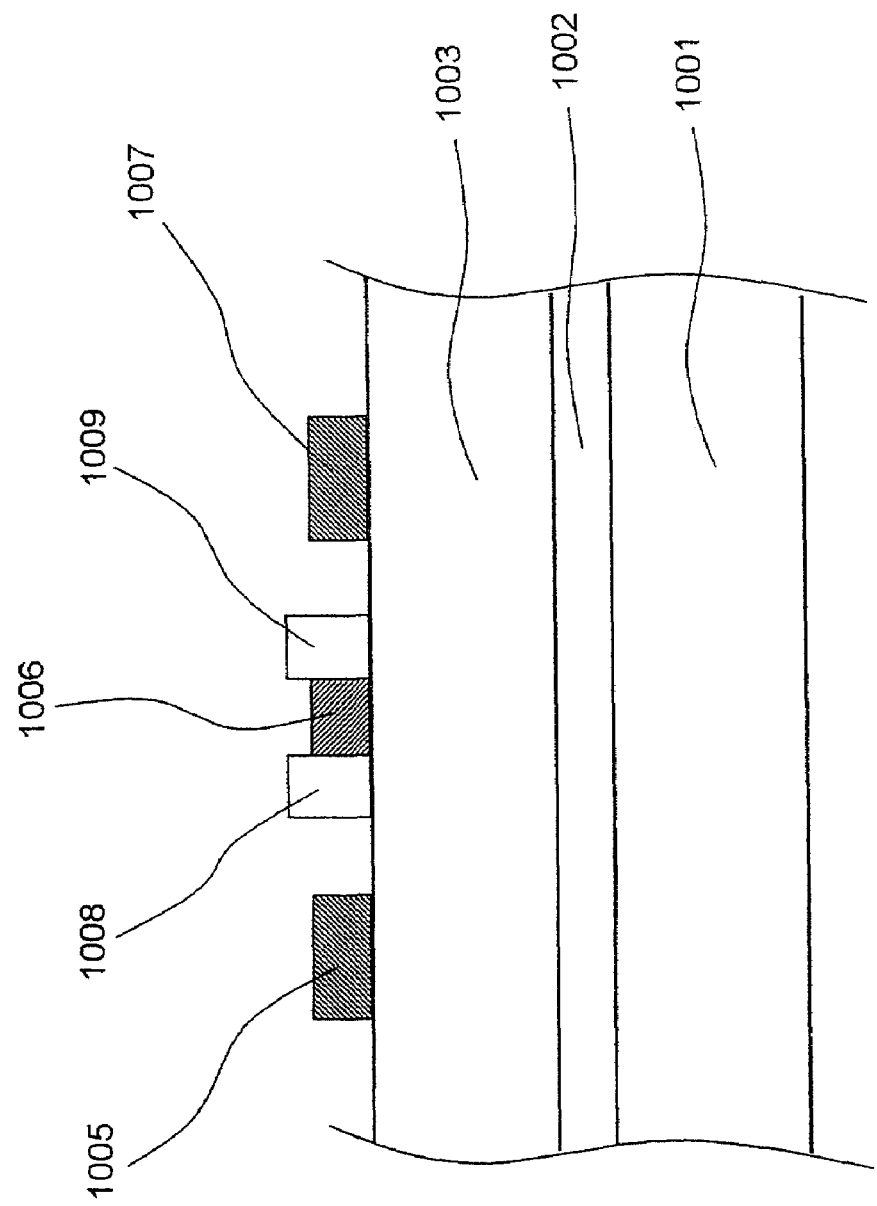
FIG. 10 is a sectional view of a Schottky diode as one example of the electronic device according to an eighth embodiment of the present invention.
Figure 11:
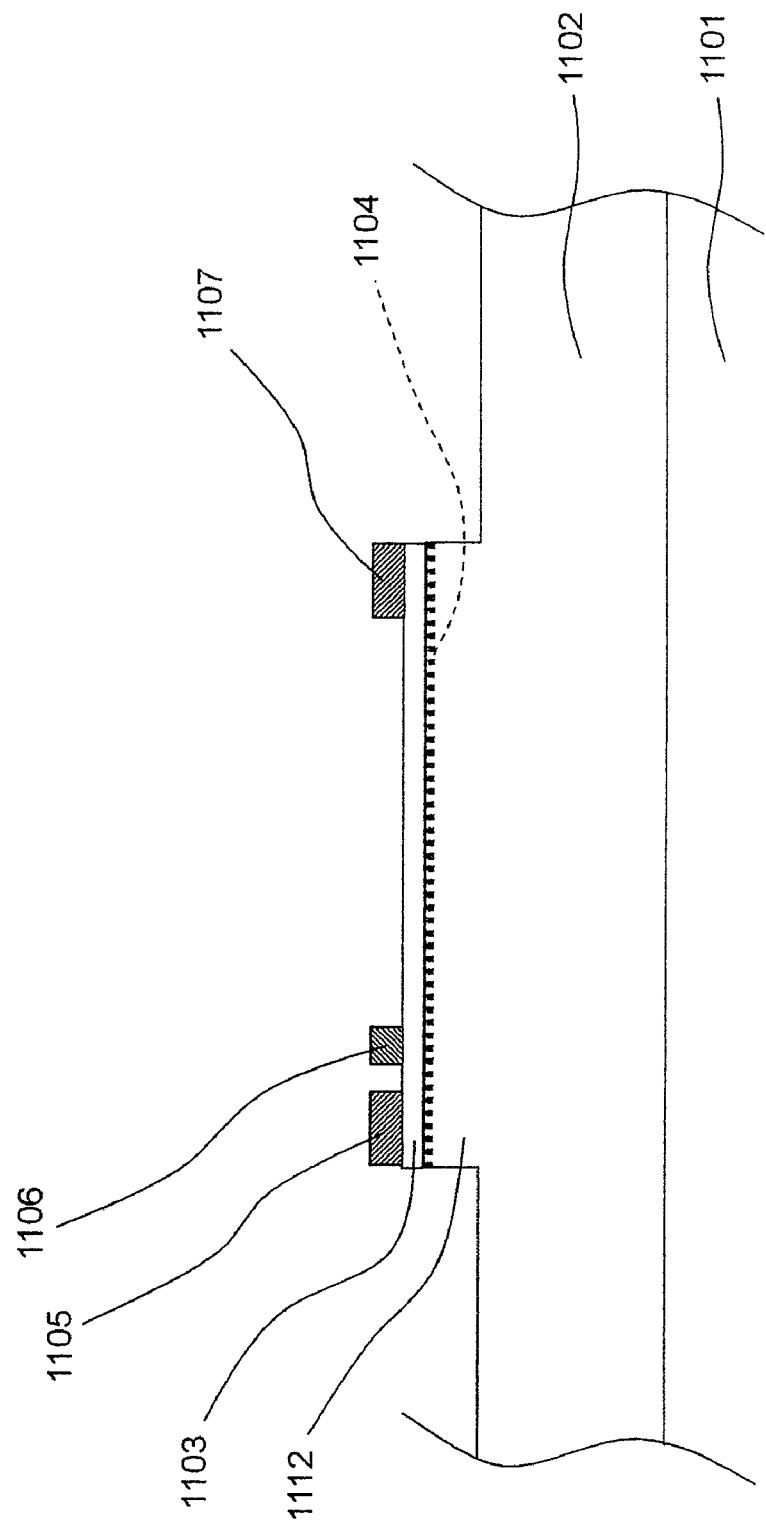
FIG. 11 is a sectional view of a heterojunction FET as a conventional electronic device.

FIG. 10 is a sectional view of a Schottky diode as one example of the electronic device of the eighth embodiment of the present invention.

As shown in FIG. 10, a 50-nm thick buffer layer 1002 made of AlN and a 3-μm thick GaN layer 1003 (impurity concentration: $1\times10^{17}$ cm$^{-3}$) made of GaN are successively formed on a sapphire substrate 1001. Next, a cathode ohmic electrode 1005 made of Ti/Al/Au, an anode Schottky electrode 1006 made of WN/Au and a cathode ohmic electrode 1007 made of Ti/Al/Au are formed on the GaN layer 1003. Further, dielectric layers 1008 and 1009 made of TiO$_2$ are formed with interposition of the anode Schottky electrode 1006 located on both sides of the anode Schottky electrode 1006 on the GaN layer 1003.

According to the Schottky diode of the construction, by using TiO$_2$ as a dielectric of a high dielectric constant for the dielectric layers 1008 and 1009 formed on the active layer made of the GaN layer 1003, the electric field distributions between the anode Schottky electrode 1006 and the cathode ohmic electrode 1005 and between the anode Schottky electrode 1006 and the cathode ohmic electrode 1007 formed on the active layer can be substantially uniformed. Therefore, a high withstand voltage can be achieved by uniforming the electric field distribution between the electrodes with a simple construction without employing the field plate structure for shielding the electric field.

Moreover, by making the dielectric constant $\in 2$ of the dielectric layers 1008 and 1009 higher than the dielectric constant $\in 1$ of the GaN layer 1003 of the active layer, the electric field distributions between the anode Schottky electrode 1006 and the cathode ohmic electrode 1005 and between the anode Schottky electrode 1006 and the cathode ohmic electrode 1007 can easily be uniformed.

Although the heterojunction FET has been described as the electronic device in the first through seventh embodiments and the GaN Schottky diode has been described as the electronic device in the eighth embodiment, the electronic device is not limited to these, and the present invention may be applied to the electronic devices of a Gunn diode, SAW, MEMS and the like.

Moreover, assuming that the thickness of the active layer is t1 and the maximum thickness of the dielectric layer is t2max in the heterojunction FET of each of the first through seventh embodiments, then the relation of the product t2max·$\in 2$ of the maximum thickness t2max of the dielectric layer and the dielectric constant $\in 2$ of the dielectric layer to the product t1·$\in 1$ of the thickness t1 of the active layer and the dielectric constant $\in 1$ of the active layer should preferably satisfy the first condition:

$$t2\text{max} \cdot \in 2 > t1 \cdot \in 1.$$

In this case, by making the product t2max·$\in 2$ of the maximum thickness t2max of the dielectric layer and the dielectric constant $\in 2$ of the dielectric layer greater than the product t1·$\in 1$ of the thickness t1 of the active layer and the dielectric constant $\in 1$ of the active layer, the electric field distribution between the electrodes can more easily be uniformed.

Further, assuming that the interval between the electrodes between which the electric field distribution is substantially uniformed is L and the maximum thickness of the dielectric layer is t2max, then the relation of the product t2max·$\in 2$ of the maximum thickness t2max of the dielectric layer and the dielectric constant $\in 2$ of the dielectric layer to the product L·$\in 1$ of the interval L between the electrodes and the dielectric constant $\in 1$ of the active layer should preferably satisfy the second condition:

$$t2\text{max} \cdot \in 2 > L \cdot \in 1.$$

In this case, by making the product t2max·$\in 2$ of the maximum thickness t2max of the dielectric layer and the dielectric constant $\in 2$ of the dielectric layer greater than the product L·$\in 1$ of the interval L between the electrodes and the dielectric constant $\in 1$ of the active layer, the electric field distribution between the electrodes can more easily be uniformed.

Moreover, both the first condition and the second condition should preferably be satisfied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An electronic device having an active layer, comprising:
a plurality of electrodes formed on the active layer; and
a dielectric layer formed on the active layer so that an electric field distribution between at least two of the plurality of electrodes is substantially uniformed, wherein
a thickness of the dielectric layer is reduced or a dielectric constant of the dielectric layer is reduced beginning from one electrode toward another of the two electrodes between which the electric field distribution is substantially uniformed.

2. A heterojunction FET comprising:
a gate electrode formed on an active layer comprised of a semiconductor;
a source electrode and a drain electrode formed on both sides of the gate electrode on the active layer; and
a dielectric layer formed on the active layer so that an electric field distribution between at least one of the source electrode and the drain electrode and the gate electrode is substantially uniformed.

3. The heterojunction FET as claimed in claim 2, wherein the dielectric layer has a dielectric constant $\in 2$ higher than a dielectric constant $\in 1$ of the active layer.

4. The heterojunction FET as claimed in claim 3, wherein, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$$t2\text{max} \cdot \in 2 > t1 \cdot \in 1.$$

5. The heterojunction FET as claimed in claim 3, wherein, assuming that an interval between the electrodes between which the electric field distribution is substantially uniformed is L and a maximum thickness of the dielectric layer is t2max, then a relation of a product t2max·$\in 2$ of the maximum thickness t2max of the dielectric layer and the dielectric constant $\in 2$ of the dielectric layer to a product L·$\in 1$ of the interval L between the electrodes and the dielectric constant $\in 1$ of the active layer satisfies a condition:

$$t2\text{max} \cdot \in 2 > L \cdot \in 1.$$

6. The heterojunction FET as claimed in claim 3, wherein, assuming that a thickness of the active layer is t1 and a maximum thickness of the dielectric layer is t2max, then a relation of a product t2max·$\in 2$ of the maximum thickness t2max of the dielectric layer and the dielectric constant $\in 2$ of the dielectric layer to a product t1·$\in 1$ of the thickness t1 of the active layer and the dielectric constant $\in 1$ of the active layer satisfies a condition:

$$t2\text{max} \cdot \in 2 > t1 \cdot \in 1, \text{ and,}$$

assuming that an interval between the electrodes between which the electric field distribution is substantially uniformed is L and a maximum thickness of the dielectric layer is t2max, then a relation of a product t2max·∈2 of the maximum thickness t2max of the dielectric layer and the dielectric constant ∈2 of the dielectric layer to a product L·∈1 of the interval L between the electrodes and the dielectric constant ∈1 of the active layer satisfies a condition:

$t2\text{max}·∈2 > L·∈1.$

7. The heterojunction FET as claimed in claim 2, wherein
the dielectric layer has a stepwise laminate structure in which a number of layers is varied step by step, and
a sum of products of a thickness and a dielectric constant of each of the steps of the dielectric layer is reduced from a thickest step toward a thinnest step adjacent to electrodes between which the electric field distribution is substantially uniformed.

8. The heterojunction FET as claimed in claim 2, wherein
a thickness of the dielectric layer is reduced or a dielectric constant of the dielectric layer is reduced beginning from one electrode toward another of the two electrodes between which the electric field distribution is substantially uniformed.

9. The heterojunction FET as claimed in claim 2, wherein
the active layer is made of a group III nitride based compound semiconductor.

10. The heterojunction FET as claimed in claim 2, wherein
the dielectric layer contains a metal oxide.

11. The heterojunction FET as claimed in claim 2, wherein
the dielectric layer is formed so that no stress is applied to the active layer.

* * * * *